United States Patent
Roberts et al.

(10) Patent No.: US 9,818,692 B2
(45) Date of Patent: Nov. 14, 2017

(54) GAN SEMICONDUCTOR DEVICE STRUCTURE AND METHOD OF FABRICATION BY SUBSTRATE REPLACEMENT

(71) Applicant: GaN Systems Inc., Ottawa (CA)

(72) Inventors: John Roberts, Kanata (CA); Greg P. Klowak, Ottawa (CA); Cameron McKnight-MacNeil, Nepean (CA)

(73) Assignee: GaN Systems Inc., Ottawa (CA)

( * ) Notice: Subject to any disclaimer, the term of this patent is extended or adjusted under 35 U.S.C. 154(b) by 0 days.

(21) Appl. No.: 15/078,023

(22) Filed: Mar. 23, 2016

(65) Prior Publication Data
US 2016/0380090 A1    Dec. 29, 2016

Related U.S. Application Data

(60) Provisional application No. 62/185,124, filed on Jun. 26, 2015, provisional application No. 62/209,930, (Continued)

(51) Int. Cl.
*H01L 23/528* (2006.01)
*H01L 21/66* (2006.01)
(Continued)

(52) U.S. Cl.
CPC ............ *H01L 23/528* (2013.01); *H01L 22/32* (2013.01); *H01L 23/3737* (2013.01);
(Continued)

(58) Field of Classification Search
CPC ............ H01L 29/7787; H01L 29/2003; H01L 29/205; H01L 29/0669; H01L 29/402;
(Continued)

(56) References Cited

U.S. PATENT DOCUMENTS 6,208,031 B1    3/2001  Fraivillig
8,703,623 B2    4/2014  Chung et al.
(Continued)

FOREIGN PATENT DOCUMENTS

CN    103730492 A  *  4/2014
WO    2015061881 A1    5/2015
WO    2015135072 A1    9/2015

OTHER PUBLICATIONS

Zhi et al. Towards Thermoconductive, Electrically Insulating Polymeric Composites with Boron Nitride Nanotubes as Fillers. Adv. Funct. Mater., 19: 1857-1862. doi:10.1002/adfm.200801435.*
(Continued)

*Primary Examiner* — Lauren R Bell
(74) *Attorney, Agent, or Firm* — Miltons IP/p.i.

(57) ABSTRACT

Devices and systems comprising high current/high voltage GaN semiconductor devices are disclosed. A GaN die, comprising a lateral GaN transistor, is sandwiched between an overlying header and an underlying composite thermal dielectric layer. Fabrication comprises providing a conventional GaN device structure fabricated on a low cost silicon substrate (GaN-on-Si die), mechanically and electrically attaching source, drain and gate contact pads of the GaN-on-Si die to corresponding contact areas of conductive tracks of the header, then entirely removing the silicon substrate. The exposed substrate-surface of the epi-layer stack is coated with the composite dielectric thermal layer. Preferably, the header comprises a ceramic dielectric support layer having a CTE matched to the GaN epi-layer stack. The thermal dielectric layer comprises a high dielectric strength thermoplastic polymer and a dielectric filler having a high thermal conductivity. This structure offers improved electrical breakdown resistance and effective thermal dissi-
(Continued)

pation compared to conventional GaN-on-Si device structures.

19 Claims, 10 Drawing Sheets

Related U.S. Application Data filed on Aug. 26, 2015, provisional application No. 62/260,275, filed on Nov. 26, 2015.

(51) Int. Cl.
| | |
|---|---|
| H01L 27/095 | (2006.01) |
| H01L 29/40 | (2006.01) |
| H01L 29/778 | (2006.01) |
| H01L 23/373 | (2006.01) |
| H01L 29/20 | (2006.01) |
| H01L 29/06 | (2006.01) |
| H01L 23/36 | (2006.01) |

(52) U.S. Cl.
CPC .......... *H01L 27/095* (2013.01); *H01L 29/402* (2013.01); *H01L 29/7786* (2013.01); *H01L 23/36* (2013.01); *H01L 29/0619* (2013.01); *H01L 29/2003* (2013.01)

(58) Field of Classification Search
CPC ....... H01L 22/32; H01L 23/528; H01L 23/34; H01L 27/095
See application file for complete search history.

(56) References Cited

U.S. PATENT DOCUMENTS

| 8,866,149 | B2 | 10/2014 | Holder et al. | |
| 2014/0159118 | A1* | 6/2014 | Lenci | H01L 21/28247 257/194 |
| 2015/0057396 | A1 | 2/2015 | Fraivillig | |
| 2015/0162252 | A1 | 6/2015 | Klowak | |
| 2016/0049351 | A1* | 2/2016 | McCann | H01L 23/3732 257/76 |
| 2016/0211205 | A1* | 7/2016 | Nagatomo | H01L 23/15 |
| 2016/0264832 | A1* | 9/2016 | Yuan | C09K 5/14 |

OTHER PUBLICATIONS

"Fast, Efficient Switching—Thanks to HiPoSwitch", PhysOrg, Apr. 15, 2015; pp. 1-3.
R. Matheson, "Making the New Silicon: Gallium Nitride Electronics Could Drastically Cut Energy Usage", PhysOrg, Jul. 29, 2015; pp. 1-3.
"Panasonic Develops a Gallium Nitride (GaN) Power Transistor with Ultra High Breakdown Voltage over 10000V", PhysOrg, Dec. 13, 2007; bpp. 1-2.
"New Method Joins Gallium Nitride and Diamond for Better Thermal Management", PhysOrg, May 1, 2013; pp. 1-2.
P. C. Chao et al., "A new high power GaN-on-Diamond HEMT with low-temperature bonded substrate technology", CS MANTECH Conference, May 13-16, 2013, New Orleans, Louisiana, USA; pp. 179-182.
Bin Lu, Daniel Piedra, and Tomas Palacios, "GaN Power Electronics", 8th International Conference on Advanced Semiconductor Devices & Microsystems (ASDAM), 2010, pp. 105-110.
Bin Lu and Tomas Palacios, "High Breakdown (> 1500 V) AlGaN/GaN HEMTs by Substrate-Transfer Technology", IEEE Electron Device Letters, vol. 31, No. 9, 2010, pp. 951-953.
Mike Cooke, "Combining Low On-Resistance with High Breakdown Voltage", Semiconductor Today Compound & Advanced Silicon, vol. 9, Issue 3, Apr./May 2014, pp. 92-93.
N. Herbecq et. al., Above 2000 V breakdown voltage on ultrathin barrier AlN/GaN-on-Silicon transistors, CS MANTECH Conference, May 18-21, 2015, Scottsdale, Arizona, USA, pp. 305-308.
J. W. Chung, et al., "GaN-on-Si Technology, a New Approach for Advanced Devices in Energy and Communications" Proceedings of the European Solid-State Device Research Conference (ESSDERC), 2010, pp. 52-56.
J. W. Chung, E. Piner, and T. Palacois, "N-face GaN/AlGaN Transistors Through Substrate Removal", IEEE, 978-1-4244-1 942-5, 2008 , pp. 199-200.
T. Paskova, D. A. Hanser and K. R. Evans, "GaN Substrates for III-Nitride Devices", Proceedings of the IEEE, (98), 7, 2010, pp. 1324-1338.
C. R. Miskys et al., "Freestanding GaN-substrates and devices", Phys. Stat. Sol. (c) 0, No. 6, 2003, pp. 1627-1650.
J. Cho et al., "Thermal Characterization of Composite GaN Substrates for HEMT Applications", IEEE Electron Device Letters, vol. 33, No. 3, Mar. 2012, pp. 378-380.
X. Xu, et al. , "Thermal conductivity enhancement of benzocyclobutene with carbon nanotubes for adhesive bonding in 3-D integration", Components, Packaging and Manufacturing Technology, vol. 2, Issue: 2, Feb. 2012; pp. 286-293.
J. Fraivillig et al., "Semiconductor-to-metal attachment with silver-filed TPI bondlines", IMAPS High Temperature Electronics Network (HiTEN 2015: Cambridge UK Jul. 6-8, 2015, pp. 64-67).
Amanda L. Tiano et al., "Boron Nitride Nanotube: Synthesis and Applications", SPIE Proceedings vol. 9060, Nanosensors, Biosensors, and Info-Tech Sensors and Systems, Apr. 2014; 19 pages.
Chunyi Zhi et al., "Towards Thermoconductive, Electrically Insulating Polymeric Composites with Boron Nitride Nanotubes as Fillers", Adv. Funct. Mater., V.19, 2009, pp. 1857-1862.
Zifeng Wang et al., "Solvent-Free Fabrication of Thermally Conductive Insulating Epoxy Composites with Boron Nitride Nanoplatelets as Fillers", Nanoscale Research Letters 2014, 9:643; pp. 1-7.
"Tekna Launches a Revolutionary Material on the Market: Boron Nitride NanoTubes"; Available online: http://tekna.com/materials-nanopowders-spherical-powders/nanopowders/bnnt/. May 27, 2015; 3 pages.

* cited by examiner

GAN SEMICONDUCTOR DEVICE STRUCTURE AND METHOD OF FABRICATION BY SUBSTRATE REPLACEMENT

CROSS-REFERENCE TO RELATED APPLICATION(S)

This application is related to U.S. provisional patent application No. 62/260,275, filed Nov. 26, 2015, entitled "GaN SEMICONDUCTOR DEVICE STRUCTURE AND METHOD OF FABRICATING BY SUBSTRATE REPLACEMENT"; U.S. provisional patent application No. 62/209,930, filed Aug. 26, 2015, entitled "GaN SEMICONDUCTOR DEVICE STRUCTURE AND METHOD OF FABRICATION BY SUBSTRATE REPLACEMENT FOR INCREASED VERTICAL BREAKDOWN RESISTANCE OF GaN POWER TRANSISTORS"; and U.S. provisional patent application No. 62/185,124, filed Jun. 26, 2015, entitled "SUBSTRATE REPLACEMENT FOR INCREASED VERTICAL BREAKDOWN RESISTANCE OF GaN POWER TRANSISTORS", all of which are incorporated herein by reference in their entirety.

This application is related to PCT International Patent Application No. PCT/CA2014/00762, filed Oct. 28, 2014 and U.S. patent application Ser. No. 14/568,507, filed Dec. 12, 2014, both entitled "FAULT TOLERANT DESIGN FOR LARGE AREA NITRIDE SEMICONDUCTOR DEVICES"; PCT International Patent Application No. PCT/CA2015/000168, filed Mar. 10, 2015, entitled "POWER SWITCHING SYSTEMS COMPRISING HIGH POWER E-MODE GaN TRANSISTORS AND DRIVER CIRCUITRY"; PCT International Patent Application No. PCT/CA2015/000244, filed Apr. 15, 2015, entitled "EMBEDDED PACKAGING FOR DEVICES AND SYSTEMS COMPRISING LATERAL GaN POWER TRANSISTORS"; and U.S. Provisional patent applications Nos. 62/131,293 and 62/131,308, filed Mar. 11, 2015, both entitled "PACKAGING SOLUTIONS FOR DEVICES AND SYSTEMS COMPRISING LATERAL GaN POWER TRANSISTORS"; all said applications are incorporated herein by reference in their entirety.

TECHNICAL FIELD

The present invention relates to fabrication of devices and systems comprising high current/high voltage nitride semiconductor devices, and particularly lateral gallium nitride (GaN) power transistors, for improved breakdown resistance and thermal dissipation.

BACKGROUND

GaN devices are expected to be widely adopted for power switches as production costs are reduced, for example, by fabrication of lateral GaN transistors on lower cost silicon substrates (GaN-on-Si die). Lateral GaN power transistors offer low on-resistance $R_{on}$ and high current capability per unit active area of the device.

To benefit from the inherent performance characteristics of lateral GaN transistors, important design considerations include, for example, device layout (topology), low inductance packaging, and effective thermal management.

The substrate material on which a GaN transistor is fabricated can significantly affect the breakdown voltage and thermal dissipation. GaN devices are typically fabricated by hetero-epitaxial growth, that is, a stack of GaN epitaxial layers (GaN epi-layer stack) is grown on a growth substrate other than GaN, typically silicon carbide (SiC) or silicon (Si).

For example, lateral GaN High Electron Mobility Transistors (HEMTs) comprise a heterolayer structure comprising a layer of GaN and an overlying layer of Aluminum Gallium Nitride (AlGaN). The GaN/AlGaN heterostructure provides a 2 Dimensional Electron Gas (2DEG) active layer. The GaN semiconductor layers are epitaxially grown on the underlying native silicon substrate ("growth substrate"). Since there is a lattice mismatch between the GaN semiconductor layers and the silicon surface, the stack of epitaxial layers (epi-layer stack) typically comprises one or more intermediate layers or buffer layers underlying the GaN/AlGaN heterostructure layers.

Significant research has been directed to methods for fabrication of GaN devices by epitaxial growth on a range of growth substrates. It is also known to grow the GaN epi-layer stack on a sacrificial low cost substrate, such as a large diameter silicon wafer, and then use substrate removal and epitaxial transfer of the GaN device structure to an alternative substrate layer.

For further background information on fabrication of GaN transistors and GaN optoelectronic devices, reference is made, by way of example, to the following:

(1) "Fast, Efficient Switching—Thanks to HiPoSwitch", PhysOrg, 15 Apr. 2015;
(2) R. Matheson, "Making the New Silicon: Gallium Nitride Electronics Could Drastically Cut Energy Usage", PhysOrg, 29 Jul. 2015;
(3) "Panasonic Develops a Gallium Nitride (GaN) Power Transistor with Ultra High Breakdown Voltage over 10000V", PhysOrg, 13 Dec. 2007;
(4) "New Method Joins Gallium Nitride and Diamond for Better Thermal Management", PhysOrg, 1 May 2013;
(5) P. C. Chao et al., "A new high power GaN-on-Diamond HEMT with low-temperature bonded substrate technology", CS MANTECH Conference, May $13^{th}$ to $16^{th}$, 2013, New Orleans, La., USA;
(6) Bin Lu, Daniel Piedra, and Tomas Palacios, "GaN Power Electronics", 8th International Conference on Advanced Semiconductor Devices & Microsystems (ASDAM), 2010, pp. 105-110;
(7) Bin Lu and Tomas Palacios, "High Breakdown (>1500 V) AlGaN/GaN HEMTs by Substrate-Transfer Technology", IEEE Electron Device Letters, Vol. 31, No. 9, 2010, pp. 951-953;
(8) Mike Cooke, "Combining Low On-Resistance with High Breakdown Voltage", Semiconductor Today Compound & Advanced Silicon, Vol. 9, Issue 3, April/May 2014, pp. 92-93;
(9) N. Herbecq et al., "Above 2000 V breakdown voltage on ultrathin barrier AL/GaN-on-Silicon transistors, CS MANTECH Conference, May 18th-21st, 2015, Scottsdale, Ariz., USA, pp. 305-307;
(10) J. W. Chung et al., "Fabrication Technique for Gallium Nitride Substrates", U.S. Pat. No. 8,703,623 B2, Apr. 22, 2014;
(11) J. W. Chung, et al., "GaN-on-Si Technology, a New Approach for Advanced Devices in Energy and Communications", Proceedings of the European Solid-State Device Research Conference (ESSDERC), 2010, pp. 52-56;
(12) J. W. Chung, E. Piner, and T. Palacios, "N-face GaN/AlGaN Transistors Through Substrate Removal", IEEE, 978-1-4244-1 942-5, 2008, pp.199-200;

(13) T. Paskova, D. A. Hanser and K. R. Evans, "GaN Substrates for III-Nitride Devices", Proceedings of the IEEE, (98), 7, 2010, pp. 1324-1338;

(14) C. R. Miskys et al., "Freestanding GaN-substrates and devices", Phys. Stat. Sol. (c) 0, No. 6, 2003, pp. 1627-1650;

(15) Holder et al., "Method for the Reuse of Gallium Nitride Epitaxial Substrates", U.S. Pat. No. 8,866,149 B2, Oct. 21, 2014; and

(16) J. Cho et al., "Thermal Characterization of Composite GaN Substrates", IEEE Electron Device Letters, Vol. 33, No. 3, March 2012, pp. 378-380.

It has been reported that fabrication of GaN epi-layers on a silicon substrate offers a ten-fold reduction in fabrication costs relative to fabrication of GaN devices on SiC substrates[1,2]. Silicon substrates are well characterized and available as large diameter wafers (e.g. 8 inches or more), at low cost. However, a known issue with GaN-on-Si devices, e.g. a GaN HEMT fabricated as a GaN/AlGaN epi-layer stack on a silicon substrate, is that the maximum breakdown voltage is limited by the silicon substrate, and is typically less than 400V. Another drawback is poorer thermal dissipation of Si substrates relative to SiC substrates.

A GaN device fabricated on a highly resistive sapphire substrate has been reported to provide an ultra-high breakdown voltage over 10,000V[3]. However, sapphire substrates have other drawbacks relative to silicon substrates, including, high cost, limited available wafer size and poor thermal conductivity.

Thus, for fabrication of GaN devices on conventional silicon substrates, several methods have been reported to improve the device breakdown voltage beyond 800V, including:

increasing the thickness of the GaN epitaxial-layers, e.g. use of a 6 µm rather than 2 µm epi-layer stack[7];

providing a buffer layer doped with iron (Fe) or carbon (C)[7];

using AlGaN based buffer layers[7];

use of Schottky-drain contacts[6];

localized removal of the substrate for improved breakdown voltage[8,9].

Another approach is to use substrate removal and epitaxial transfer. A GaN epi-layer structure is grown on a low cost silicon substrate; a carrier wafer is attached to the top surface, e.g. by a wafer bonding technique; the underlying silicon growth substrate is removed entirely; and then the GaN epi-layer structure is bonded to another substrate or submount.

For example, an improvement in breakdown voltage can be achieved by epitaxial transfer to an electrically isolating substrate, such as sapphire or glass[7]. However, these substrates have poorer thermal conductivity than silicon or silicon carbide. While they improve breakdown voltage, lack of thermal dissipation leads to high operational temperatures, which adversely affects device performance, and/ or causes early device failure.

It is well known that synthetic diamond substrates have high thermal conductivity, e.g. up to ~2000 W/m·K, significantly greater than that of sapphire, silicon or silicon carbide substrates. Substrate removal and epi-layer transfer to a diamond substrate or localized substrate removal and provision of diamond filled thermal vias in a silicon carbide substrate has been reported[4,5]. However, as taught by Chao[5], bonding of a GaN epi-layer structure to a diamond substrate requires specialized processing, and there is a significant mismatch of the Coefficient of Thermal Expansion (CTE) between GaN and diamond.

The above-mentioned cost benefits of fabrication of GaN devices on low cost silicon substrates are, at least in part, due the availability of low cost, large diameter silicon wafers, i.e., 8 inch diameter or more. Thus, the use of silicon growth substrates for GaN devices provides economies of scale as well as compatibility with established wafer processing technologies. Alternative growth substrates, and alternative substrates for epitaxial transfer, such as diamond or sapphire, are currently available only as smaller diameter wafers, and require more costly processing and wafer bonding. These substrates result in significantly higher fabrication costs per unit area compared to silicon substrates.

Thus, there is a need for alternative nitride semiconductor device structures and methods of fabrication of nitride power semiconductor devices, such as GaN power transistors and systems comprising one or more lateral GaN power transistors, which address the above mentioned problems and provide for improved vertical breakdown and effective thermal dissipation.

An object of the present invention is to provide a device structure and a method of fabrication for GaN power devices, such as GaN/AlGaN HEMTs, which is compatible with conventional epitaxial growth of GaN epi-layers on low cost silicon substrates, and which provides for improved breakdown voltage as well as effective thermal dissipation.

SUMMARY OF INVENTION

The present invention seeks to provide improved or alternative structures and methods of fabrication of nitride semiconductor devices, such as GaN power transistors and systems using one or more lateral GaN power transistors.

Aspects of the invention provide a nitride semiconductor device structure, a wafer scale nitride semiconductor device structure, and method of fabrication thereof, wherein a GaN die, comprising a GaN epi-layer stack for a lateral GaN transistor, is sandwiched between an overlying header, comprising a support layer of a relatively thick dielectric, having a CTE matched to that of the GaN epi-layer stack, and an underlying, relatively thin, composite thermal dielectric layer. The resulting structure provides for increased vertical breakdown resistance of GaN power transistors, as well as improved thermal dissipation relative to GaN-on-Si device structure.

One aspect of the invention provides a nitride semiconductor device structure comprising:

a GaN die comprising a lateral GaN transistor, the GaN die being sandwiched between an overlying header and an underlying composite thermal dielectric layer;

the GaN die comprising:

a GaN epi-layer stack comprising a GaN/AlGaN heterolayer structure defining a two Dimensional Electron Gas (2DEG) active layer for the lateral GaN transistor;

a metallization layer formed thereon defining source and drain electrodes of the lateral GaN transistor, and a gate electrode formed on a channel region between respective source and drain electrodes of the lateral GaN transistor, said source, drain and gate electrodes being provided on a front-side (device side) of the epi-layer stack; and overlying source, drain and gate contact areas (pads) for the lateral GaN transistor on a respective front-side of the GaN die;

the overlying header comprising:

a support substrate comprising a dielectric material having a Coefficient of Thermal Expansion (CTE) matched to the epi-layer stack and a conductive metallization layer formed on the support substrate defining conductive tracks for source, drain and gate interconnections;

the header being attached to the GaN die by low inductance conductive interconnections between contact areas of said conductive tracks and respective source, drain and gate pads of the lateral GaN transistor; and the composite thermal dielectric layer comprising:

a high dielectric strength polymer dielectric and a dielectric filler, the high dielectric strength polymer dielectric comprising one of a polyimide and an epoxy, and the dielectric filler being a material having a high dielectric strength and a high thermal conductivity selected from the group consisting of Boron Nitride (BN), Aluminum Nitride (AlN), Silicon Nitride ($Si_3N_4$), diamond (C), and mixtures thereof, the composite thermal dielectric layer forming a coating on a back-side (growth substrate-side) of the GaN epi-layer stack.

Another aspect of the invention provides a wafer scale nitride semiconductor device structure comprising:

a GaN wafer comprising a plurality of GaN die, each GaN die comprising a lateral GaN transistor, and each GaN die being sandwiched between an overlying header and an underlying composite thermal dielectric layer;

each GaN die comprising:

an GaN epi-layer stack comprising a GaN/AlGaN hetero-layer structure defining a 2DEG active layer of the lateral GaN transistor, a metallization layer formed thereon defining source and drain electrodes of the plurality of lateral GaN transistors, and a gate electrode formed on a channel region between respective source and drain electrodes of said lateral GaN transistor, said source, drain and gate electrodes being provided on a front-surface (device side) of the epi-layer stack;

and each GaN die comprising overlying source, drain and gate contact areas (pads) for the lateral GaN transistor;

the overlying header wafer comprising:f a support layer of a dielectric material having a CTE matched to the epi-layer stack, and a metallization layer formed thereon defining conductive tracks for source, drain and gate interconnections;

the header being attached to the GaN die by low inductance conductive interconnections between contact areas of said conductive tracks and respective source, drain and gate pads of the plurality of lateral GaN transistors; and an underlying composite thermal dielectric layer comprising:

a high dielectric strength polymer dielectric and a dielectric filler, the high dielectric strength polymer dielectric comprising one of a polyimide and an epoxy, and the dielectric filler being a material having a high dielectric strength and a high thermal conductivity selected from the group consisting of Boron Nitride (BN), Aluminum Nitride (AlN), Silicon Nitride ($Si_3N_4$), and diamond (C), and the composite thermal dielectric layer forming a coating on a back-side (growth substrate-side) of the GaN epi-layer stack.

The high dielectric strength polymer preferably comprises a thermoplastic polymer, for example, a thermoplastic polyimide (TPI) or thermoplastic epoxy. The dielectric filler is preferably selected from the group consisting of a micro-particulate or nano-particulate form of Boron Nitride (BN), Aluminum Nitride (AlN), Silicon Nitride ($Si_3N_4$), and diamond (C). For example, said micro-particulate form comprises micro-particles, micro-flakes, micro-platelets, micro-fibers, nano-particles, nano-platelets, nano-tubes, nano-fibers, and mixtures thereof.

In one embodiment, the polyimide comprises a thermoplastic polyimide (TPI) and the dielectric filler is selected from the group consisting: Boron Nitride Nano-Tubes (BNNT); Cubic boron nitride powder (c-BN), Boron Nitride nano-particles; hexagonal Boron Nitride flakes (h-BN); and mixtures thereof. A material of this composition is applied by a low temperature process, such as spin-coating, and may comprise one or more spin-coated layers.

In an embodiment, the composite thermal dielectric layer has a thickness in the range from 10 μm to 50 μm and the device structure, comprising the heatspreader, provides a breakdown strength in the range from 850 V to 2000V and a thermal resistance of less than 1° C./W. The relatively thick header provides mechanical support for the device structure and the relatively thin composite thermal dielectric layer provides high breakdown strength and low thermal resistance relative to a silicon substrate.

The device structure may further comprise a heatspreader that is adhesively bonded to the back-side of the GaN epi-layer stack by said composite thermal dielectric layer.

The heatspreader may be a layer, sheet or wafer of a ceramic dielectric material. The ceramic material preferably has a high dielectric strength and a high thermal conductivity selected from the group consisting of Boron Nitride (BN), Aluminum Nitride (AlN), Silicon Nitride ($Si_3N_4$), and diamond (C). The ceramic heatspreader layer is bonded to the back-side of the GaN epi-layer stack by said composite thermal dielectric layer.

Alternatively, the heatspreader may comprise a conventional metal or a metal alloy heatspreader, adhesively bonded to the back-side of the GaN epi-layer stack by said composite thermal dielectric layer.

The nitride semiconductor device structure may further comprise a back-side conductive layer formed on the back-side of the epi-layer stack, which is patterned to form one or more field plates for each of the plurality of lateral GaN transistors. The conductive layer, e.g. a metal layer, may be patterned on the back-side of the epi-layer stack to define field plates, comprising metal under the source and gate, extending some distance under the channel, i.e. before providing the composite thermal dielectric layer thereon. Thus, the field plates lie between the back-side of the epi-layer and the composite thermal dielectric layer.

Alternatively, a conductive layer is formed on the composite thermal dielectric layer, and the conductive layer is patterned to define one or more back-side field plates or contact areas of the lateral GaN transistor. The conductive layer may comprise a metal layer or a conductive metal filled polymer material, such as silver filled TPI.

A further aspect of the invention provides a method of fabricating a semiconductor device structure comprising:

providing a GaN die comprising a growth substrate having formed thereon a GaN epi-layer stack; the GaN epi-layer stack comprising a GaN/AlGaN hetero-layer structure defining a 2DEG active layer for a lateral GaN transistor; a conductive metallization layer formed thereon defining source and drain electrodes of the lateral GaN transistor, and a gate electrode formed on a channel region between respective source and drain electrodes of the lateral GaN transistor, said source, drain and gate electrodes being provided on a front-face of the epi-layer stack; and overlying source, drain and gate contact areas (pads) for the lateral GaN transistor on a respective front-face of GaN die;

providing a header comprising a support layer of dielectric material having a CTE matched to the epi-layer stack, and a conductive metallization layer formed on the support layer defining conductive tracks and contact areas for source, drain and gate interconnections, said contact areas for source, drain and gate interconnections having an arrangement for alignment and vertical interconnection with respective source, drain and gate pads of the GaN die;

aligning and assembling the GaN die and the header by providing low inductance conductive interconnections mechanically and electrically interconnecting the source, drain and gate pads of the GaN die with the respective source, drain and gate contact areas of conductive tracks of the header;

removing the growth substrate from the backside of the epi-layer stack to expose a substrate surface of the GaN epi-layer stack, leaving the GaN epi-layer stack supported by the header; and applying a composite thermal dielectric layer on the substrate surface of the GaN epi-layer stack, the composite thermal dielectric layer comprising a high dielectric strength polymer dielectric and a dielectric filler, the high dielectric strength polymer dielectric comprising one of a polyimide and an epoxy, and the dielectric filler being a material having a high dielectric strength and a high thermal conductivity selected from the group consisting of Boron Nitride (BN), Aluminum Nitride (AlN), Silicon Nitride ($Si_3N_4$), and diamond (C).

The composite thermal dielectric layer preferably comprises a thermoplastic polyimide or epoxy, containing a micro-particulate or nano-particulate dielectric filler, in a form which can be applied by spin-coating or other low temperature coating or deposition process. If applied by spin-coating, the composite thermal dielectric layer may comprise a plurality of spin-coated layers to provide a thickness that provides a required breakdown voltage, while also providing low thermal resistance.

The method may further comprise attaching a heatspreader, using the composite thermal dielectric layer as an adhesive bonding layer. The heatspreader may comprise a metal, metal alloy, or thermally conductive ceramic material. The method may comprise a multi-stage curing of the thermal dielectric material. For example, the method comprises providing a spin-coating of one or more layers, partially curing the one or more layers and then applying the heatspreader primed with a thin coating of the same material, and completing the curing to adhesively bond the heatspreader.

By way of example, the method comprises providing a header comprising a ceramic support layer or wafer having a thickness of ~300 μm or more, a GaN epi-layer stack having a thickness in a range from 2 μm to 6 μm after removal of the growth substrate, and a composite thermal dielectric layer having a thickness in a range from 10 μm to 50 μm.

The method comprises interconnecting the source, drain and gate pads to the respective source, drain and gate contact areas of the conductive tracks of the interconnections of the ceramic header using low inductance conductive interconnections, e.g. comprising solder tipped copper posts, or with a layer of sintered silver, or other suitable conductive attach material, which provides for mechanical attachment and has excellent electrical conductivity.

The method may further comprise providing a conductive layer on the back-side of the epi-layer stack, and patterning said conductive to form field plates for each of the plurality of GaN transistors. The conductive layer may be a metal layer. A back-side metallization layer may alternatively be formed on the composite thermal dielectric layer and comprise a metal layer or a composite conductive material such as silver filled TPI.

In variants of the method of the embodiments, some steps may be performed before or after dicing of the wafer to provide individual GaN-on-Si die. For example, the method may comprise testing individual GaN-on-Si die before mechanically and electrically interconnecting the respective source, drain and gate pads of the lateral GaN transistor with the source, drain and gate interconnections of the dielectric header.

In the resulting inverted substrate structure, the "underlying" native silicon substrate (i.e. original growth substrate), on which the GaN epi-layer stack is formed, is completely removed and the "overlying" relatively thick dielectric header becomes the mechanical support for the device structure. This means that the "underlying" composite thermal substrate layer may be made quite thin. This layer must be thick enough to provide a required breakdown strength. If, for example, the material has a breakdown strength of ~40V/micron to ~200V/micron, a layer thickness of 10 μm to 50 μm potentially provides a device structure with a breakdown voltage in the range from 850V to 2000V or more, while a layer of this thickness also provides a short thermal path, with low thermal resistance, to enable effective heat dissipation.

Thus, there is provided a nitride semiconductor device structure and a method of fabrication thereof, for increased vertical breakdown resistance and improved thermal dissipation relative to GaN-on-Si device structures. In particular, the device structure and method of fabrication is applicable for GaN devices and systems comprising one or more lateral GaN power transistors.

BRIEF DESCRIPTION OF THE DRAWINGS

In the drawings, identical or corresponding elements in the different Figures have the same reference numeral, or corresponding elements have reference numerals incremented by 100 in successive Figures.

The foregoing and other objects, features, aspects and advantages of the present invention will become more apparent from the following detailed description, taken in conjunction with the accompanying drawings, of preferred embodiments of the invention, which description is by way of example only.

DETAILED DESCRIPTION OF EMBODIMENTS

Figure 1:
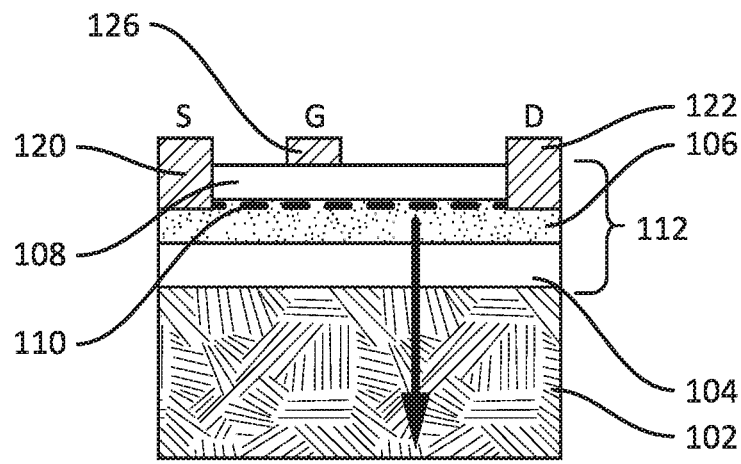
FIG. 1 (Prior Art) shows a simplified schematic cross-sectional diagram of a lateral GaN power transistor comprising a GaN/AlGaN hetero-layer structure providing a 2DEG active region, fabricated on a silicon substrate using a conventional GaN-on-Si process flow.

FIG. 1 illustrates schematically a simplified cross-sectional view of a conventional device structure 100, comprising a lateral GaN power transistor, fabricated on a silicon substrate 102. The GaN semiconductor layers comprise one or more buffer layers or intermediate layers 104, a GaN layer 106, and an overlying AlGaN layer 108, which are formed epitaxially on the native silicon substrate 102. The latter may be referred to as the growth substrate. The GaN/AlGaN heterostructure layers 106/108 create a 2DEG active region 110 in device regions of the GaN-on-Si substrate. The stack of GaN epitaxial layers that is formed on the silicon substrate, i.e. intermediate layers 104, GaN layer 106, and AlGaN layer 108, and any intervening layers not actually illustrated, will be referred to below as the "epi-layer stack" or "epi-stack" 112. After formation of the epi-stack 112, source, drain and gate electrodes are formed. For example, a conductive metal layer, e.g. a layer of aluminum/titanium (Al/Ti) which forms an ohmic contact with the underlying GaN heterostructure layer, is deposited to define a source electrode 120 and a drain electrode 122. A gate electrode 126, is also defined over the channel region between the source and drain electrodes, e.g. a palladium (Pd) gate electrode. The arrow in FIG. 1 indicates the thermal and electrical breakdown path through the silicon substrate. The thicknesses of layers are not shown to scale. Typically the GaN epi-layer stack has a thickness of about 2 µm to 6 µm, while the silicon substrate may have a thickness of 200 µm to 500 µm or more. The silicon substrate may be thinned somewhat during wafer post-processing after fabrication of the semiconductor layers is completed. However, the silicon substrate must be thick enough to provide mechanical support for the GaN-on-Si die. The device structure of FIG. 1 may be fabricated by any appropriate or conventional GaN-on-Si process technology.

Although only one transistor element is illustrated in the simplified schematic in FIG. 1, it will be appreciated that large area, multi-island lateral GaN HEMTs may be provided, e.g. as disclosed in the Applicant's related co-pending U.S. patent application Ser. No. 14/568,507, entitled "Fault Tolerant Design for Large Area Nitride Semiconductor Devices" and references cited therein. As is conventional, many GaN-on-Si die are patterned on a single, large area silicon substrate wafer and the wafer is then diced to provide separate individual GaN-on-Si die.

Figure 2:
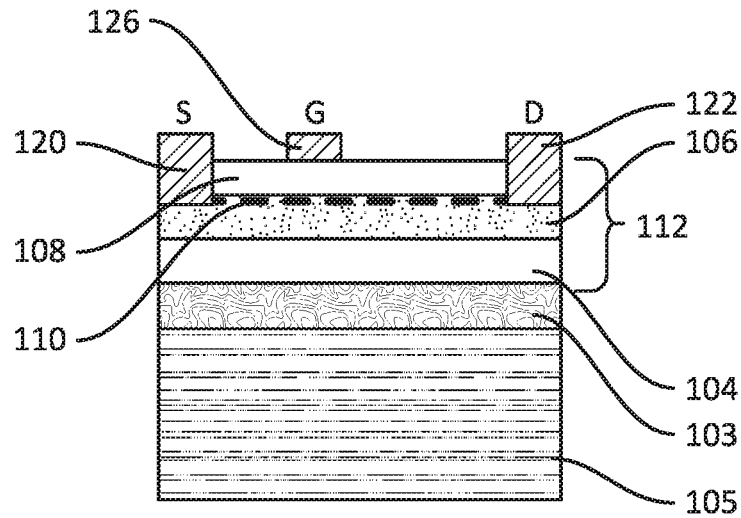
FIG. 2 (Prior Art) shows a simplified schematic cross-sectional diagram of a lateral GaN power transistor comprising a GaN/AlGaN heterostructure providing a 2DEG active region, fabricated by an alternative known process flow using substrate transfer technology.

FIG. 2 shows a simplified schematic cross-sectional diagram of a device structure 200 comprising a lateral GaN power transistor structure comprising a GaN/AlGaN heterostructure providing a 2DEG active region comprising a GaN-on-glass die. This structure is fabricated by an alternative known process flow comprising substrate transfer, e.g. as disclosed by Lu et al.[7]. This GaN-on-glass die would initially be fabricated on a native silicon substrate, as shown in FIG. 1. Thus, like parts are referred to by the same reference numerals. However, after conventional processing steps are completed, which results in the structure shown in FIG. 1, a temporary carrier wafer, e.g. another silicon wafer, is attached adhesively to the front-side (top) of the finished GaN-on-Si wafer. For example, the temporary carrier wafer is temporality attached using a benzocyclobutene (BCB) adhesive layer, as illustrated in FIG. 1 of Lu et al. The native silicon substrate on the back-side of the structure is then removed, e.g. using SF6 plasma etching. An electrically isolating glass wafer 105 is attached adhesively to the underside of the epi-stack in place of the native (original) Si substrate, also using a BCB adhesive layer. Subsequently the temporary silicon carrier wafer is removed from the top side of the device structure, and the wafer is diced into individual GaN-on-glass die. The non-conductive glass substrate increases the vertical breakdown of the lateral transistor. However, this structure requires relative thick glass substrate, since it replaces the native silicon substrate and becomes the primary substrate and mechanical support. However, both the adhesive layer and glass substrate adds thermal resistance and thus this structure does not address issues of thermal dissipation.

Figure 3:
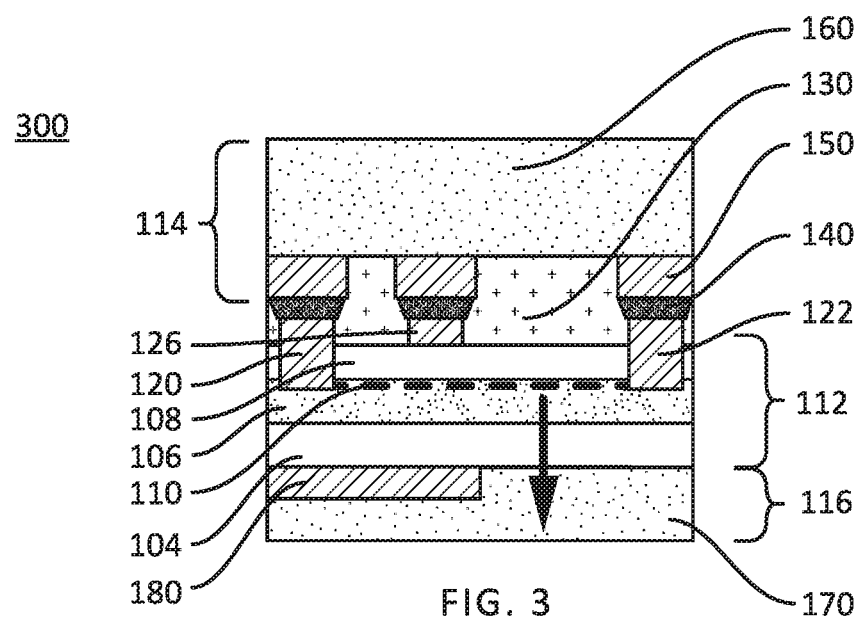
FIG. 3 shows a simplified schematic cross-sectional diagram of a lateral GaN power transistor comprising a GaN/AlGaN heterostructure providing a 2DEG active region, according to an embodiment of the present invention.

A nitride semiconductor device structure 300, comprising a lateral GaN power transistor, e.g. a GaN/AlGaN HEMT, according to an embodiment of the present invention is shown in FIG. 3. The lateral GaN/AlGaN HEMT comprises a GaN epi-stack 112, similar to that shown in FIG. 1, comprising one or more intermediate or buffer layers 104, a GaN layer 106 and an overlying AlGaN layer 108. The GaN/AlGaN heterolayer structure 106/108 defines a 2DEG active layer 110 in active regions of the die. However, in contrast to the structures shown in FIGS. 1 and 2, the epi-layer stack 112 of the GaN transistor is sandwiched between an overlying (front-side) header 114 and an underlying (back-side) composite thermal dielectric layer. The header 114 is thick enough to act as a support substrate for the GaN device structure, e.g. ~300 µm. The composite thermal dielectric layer is relatively thin, e.g. 10 µm to 50 µm, that is, thick enough to provide a required breakdown strength, but thin enough to provide low thermal resistance.

In the device structure 300, after removal of the silicon growth substrate, the header 114 is the primary supporting substrate, i.e. for mechanical support, and, as such, comprises a support layer 160 comprising a thick dielectric layer, such as, a ceramic wafer or sheet. The dielectric support layer preferably comprises a ceramic material that has a CTE closely matched to that of the GaN epi-layer stack, e.g. silicon nitride ($Si_3N_4$) or aluminum nitride (AlN).

Conductive tracks 150 are provided on the support layer 160. The conductive metal tracks 150 are patterned to define source, drain and gate interconnections and respective contact areas on the support layer 160. The conductive metal tracks 150 are mechanically and electrically interconnected to the respective source electrode 120, drain electrode 122 and gate electrode 126 of the transistor, using a suitable conductive attach material 140 to provide low inductance conductive interconnections. For example, the layer of attach material 140 is silver sinter or other conductive material, e.g. solder tipped copper posts, which provide low resistance electrical connections, as well as mechanical attachment of the header 114 to the GaN die.

The underlying substrate 116 comprises a layer of a composite thermal dielectric material 170, provided on the underside of the epi-stack. The composite thermal dielectric layer 170 comprises materials that have a high dielectric strength and a high thermal conductivity, and more particularly the composite thermal dielectric layer comprises a high dielectric strength polymer dielectric and a dielectric filler.

The high dielectric strength polymer dielectric comprises one of a polyimide and an epoxy, preferably a thermoplastic polyimide (TPI). Kapton™ is one example of a commercially available form of TPI which is well characterized. Cured layers of TPI have an exceptionally high dielectric strength similar to that of bulk polyimide such as Kapton, i.e. ~300V/µm, which is 10× to 20× that of most ceramic dielectrics. Conventionally, TPI may be provided as thin layers to provide thin bondlines between two layers, e.g. 6 µm after curing.

The dielectric filler comprises a material having a high dielectric strength and a high thermal conductivity such as Boron Nitride (BN), Aluminum Nitride (AlN), Silicon Nitride ($Si_3N_4$), diamond (C), and mixtures thereof. The particle size of the filler and the filler fraction is selected to impart good thermal conductivity to the composite material. The composite thermal dielectric layer is preferably provided in a form that can be applied by a conventional low temperature process, such as a spin-coating on the back-side (growth substrate-side) of the GaN epi-layer stack. To provide a required thickness, the layer may comprise, for example, one or more spin-coated layers, and may be provided by a multistage curing process.

Removal of the silicon growth substrate and provision of a thin composite thermal dielectric layer with high dielectric strength and high thermal conductivity results in a device structure having a high breakdown voltage and effective thermal dissipation.

Since the finished structure is inverted with respect to its formation on the silicon growth substrate, the references herein to overlying layer or front-side, or device side, of the device structure and to underlying layer or back-side of the device structure are defined with respect to the growth direction of epi-layer stack, assuming the back-side of the epi-layer stack is the initially formed buffer or intermediate layer(s) 104 (i.e. growth-substrate side) and the front side (device side) comprises the GaN/AlGaN hetero-layer structure. The overlying on-chip metallization provides a first level of conductive interconnect.

Because the epi-stack 112 is supported by the header 114, the thermal dielectric layer 170 may be thin to reduce the thermal path length, as illustrated by the arrow in FIG. 3, for improved thermal dissipation. By removal of the silicon growth substrate, the vertical breakdown path is removed, for improved breakdown resistance. For example, the composition and thickness of the composite thermal dielectric layer may be selected to provide a breakdown resistance that exceeds 1200V, 1500V, or more.

In a preferred embodiment, the thermal dielectric material comprises a thermoplastic polyimide (TPI) with dielectric filler particles comprising micro-particles or nano-particles of suitable ceramic material, which is electrically insulating and thermally conductive. For example, the particulate dielectric filler may comprise micro-particles and/or nano-particles of a material with high thermal conductivity, such as, silicon nitride, boron nitride, or aluminum nitride. The dielectric filler may comprise non-conductive carbon nano-tubes or boron nitride nano-tubes, or mixtures thereof.

The particulate dielectric filler should be in a form that does not substantially diminish the electrically insulating properties of the polymer dielectric. For example, it is known to add particulate fillers of conductive materials, such as, silver or carbon nano-tubes, to polymer dielectrics to improve thermal conductivity or to provide electrically conductive composite layers such as conductive epoxies, or conductive thermoplastic polyimides (TPI) for electronic applications. Reference is made, by way of example, to: (17) an article entitled "Thermal conductivity enhancement of benzocyclobutene with carbon nanotubes for adhesive bonding in 3-D integration" by X. Xu, et al., Components, Packaging and Manufacturing Technology, IEEE Transactions on, (Volume: 2, Issue: 2, pp. 286-293, November 2011); (18) an article entitled "Semiconductor-to-metal attachment with silver-filed TPI bondlines" by J. Fraivillig et al., IMAPS High Temperature Electronics Network (HiTEN 2015: Cambridge UK Jul. 6-8, 2015, pp. 64-67); (19) United States Patent publication No. 2015/0057396 A1 to J. Fraivillig, entitled "Robust Interface Bonding with B-staged Thermoplastic Polyimide Adhesive"; and (20) U.S. Pat. No. 6,208,031 issued Mar. 27, 2001 to J. Fraivillig, entitled "Circuit fabrication using a particle filled adhesive".

Thus, for the current application, these types of polymer dielectric materials filled with electrically conductive filler particles would be unsuitable as the thermal dielectric layer for high voltage, high current lateral GaN transistors. That is, even if they could provide a substrate layer with improved thermal conductivity relative to a silicon substrate, these materials would provide a conductive layer or path, which would adversely affect the breakdown voltage of the transistor.

Thus, a suitable thermal dielectric layer for embodiments of the present invention comprises a composite thermal dielectric layer comprising a high dielectric strength polymer dielectric and a dielectric filler. The high dielectric strength polymer dielectric preferably comprises a polyimide and an epoxy with a high dielectric strength of the type typically used as dielectric layers in semiconductor devices, semiconductor packaging and circuit board technology, e.g. a Thermoplastic Polyimide (TPI), which, when cured, has dielectric properties similar to Kapton.

A thermoplastic polyimide or thermoplastic epoxy allows for some flexibility to adapt to materials of having different CTE. In particular, TPI is known to adhere well to semiconductor a range of semiconductor materials and dielectric materials, including ceramic dielectrics materials such as silicon nitride. TPI also adheres to metals such as aluminum and copper used for metal heatspreaders. TPI may be applied to a required thickness by spin-coating of one or more coats, or by lamination of a plurality thin foils or lamina of partially cured material. If required, surfaces may be coated or pre-primed with an ultra-thin layer to facilitate bonding or adhesion. TPI is durable across a wide range of environmental conditions (i.e. thermal, physical, and chemical conditions) and can accommodate some CTE mismatch between laminated materials. The condensation reaction which forms TPI from polyamic acid precursor (A-stage) can generally be performed at a low temperature, i.e. 200° C. to 300° C. The precursor has low viscosity and can be dispensed or spin-coated to provide layers up to 6 µm thick. A partially cured layer is referred to as B-stage, and a fully cured layer is referred to as C-stage. Spin coating of a plurality of layers may be used to build up a larger thickness. A partially cured, B-stage layer may be used to bond a metal or ceramic heat-spreader, such as a layer or wafer of bulk silicon nitride, or a metal heatspreader.

Cured, unfilled TPI has a dielectric strength of ~200 V/micron to 300 V/micron.

The dielectric filler is a material having a high dielectric strength and a high thermal conductivity. Preferred dielectric filler materials include Boron Nitride (BN), Aluminum Nitride (AlN), Silicon Nitride ($Si_3N_4$), and diamond (C), and mixtures thereof.

The composite thermal dielectric layer preferably has a high enough dielectric strength such that a thickness in a range 10 microns to 50 microns provides a breakdown voltage in a range from 850V to 2000V, and preferably at least 1200V. That is, the layer has a dielectric strength of at least 100V/micron, and more preferably 200V/micron, or more.

Preferred dielectric filler materials have high thermal conductivity and high dielectric strength and can be mixed with the polymer dielectric in sufficient amount (filler fraction) to impart good thermal conductivity to the composite material, while maintaining a high dielectric strength. For a composite dielectric layer that is tens of microns thick, preferably the dielectric filler material is in a micro-particulate form, and more preferably a nano-particulate form. Thus, dielectric filler materials are preferably selected from micro-particles or nano-particles of materials having high thermal conductivity and high dielectric strength including e.g. boron nitride, silicon nitride, aluminum nitride or diamond, or mixtures thereof.

Bulk forms of these materials, i.e. a thin film or sheet, have a high dielectric strength and high thermal conductivity. A layer of these materials in bulk form can be used as an electrically non-conductive heatspreader.

A dielectric filler material of particular interest is Boron Nitride Nano-Tubes (BNNT). Microscopically this material appears to have a fibrous form and is characterized by an exceptionally high thermal conductivity and high dielectric strength. For example, further information regarding BNNT materials is disclosed in the following references: (21) Amanda L. Tiano et al., "Boron Nitride Nanotube: Synthesis and Applications", SPIE Proceedings Vol. 9060, Nanosensors, Biosensors, and Info-Tech Sensors and Systems, April 2014, which discloses methods for synthesis of boron nitride nanotubes (BNNT) and their properties; (22) Chunyi Zhi et al., "Towards Thermoconductive, Electrically Insulating Polymeric Composites with Boron Nitride Nanotubes as Fillers", Adv. Funct. Mater., V.19, 2009, pp. 1857-1862, which discloses polymeric composites of poly methy methacrylate (PMMA), poly vinyl butyral (PVB), polystyrene (PS) or poly(ethylene vinyl alcohol (PEVA, filled with Boron Nitride Nanotubes (BNNT) for improved thermal conductivity (1.8 to 2.5 W/m·K) for use as electronic packaging materials; and (23) Zifeng Wang et al., "Solvent-Free Fabrication of Thermally Conductive Insulating Epoxy Composites with Boron Nitride Nanoplatelets as Fillers", Nanoscale Research Letters 2014, 9:643 discloses a thermal interface material comprising an epoxy composite filled with boron nitride nano-platelets (BNNP), which provides thermal conductivities up to 5.24 W/m~K for higher filler fractions. BNNT materials are now commercially available from Tekna (24) (http://tekna.com/materials-nanopowders-spherical-powders/nanopowders/bnnt/).

Provision of back-side field plates also further improves the breakdown resistance of the device structure. For example, a conductive metallization layer 180 is provided on the back-side of the epi-layer stack, and patterned for use as a field plate, with metal under the source and gate and extending some distance into the channel. The conductive layer 180 is provided before the composite thermal dielectric layer 170 is formed.

The dielectric layer 160 of the front-side header structure 114 comprises a suitable ceramic dielectric with excellent thermal conductivity, and with a CTE well matched to the GaN epi-layer stack 112. Because the ceramic substrate layers 160 provides mechanical strength to the structure, it would typically be provided as a wafer, e.g. having a thickness of 200 µm to 300 µm, or more, depending on the wafer diameter or die size. The composite thermal dielectric layer has a thickness that is sufficient to provide a required breakdown strength, e.g. a thickness in a range of 10 µm to 50 µm to provide a breakdown strength of 1200V. Thus, the relatively thin composite thermal dielectric provides significantly improved breakdown strength relative to the original native Si substrate wafer, and also provides a short thermal path and reduced thermal resistance.

Since the ceramic substrate 160 is directly interconnected by the metal tracks to the on-chip metal defining the source, drain and gate pads, using conventional conductive attach materials and techniques, the need for an organic adhesive layer, such as benzocyclobutene, is eliminated. As required, any gaps between conductive components are filled with dielectric underfill 130, which also mechanically strengthens the structure, to reduce risk of damage during conventional wafer post-processing, e.g. dicing to provide individual device die.

By way of example, FIGS. 4A to 4E show simplified schematic cross-sectional diagrams to illustrate steps in a process flow to fabricate a device structure according to an embodiment, such as shown in FIG. 3.

Figure 4A:
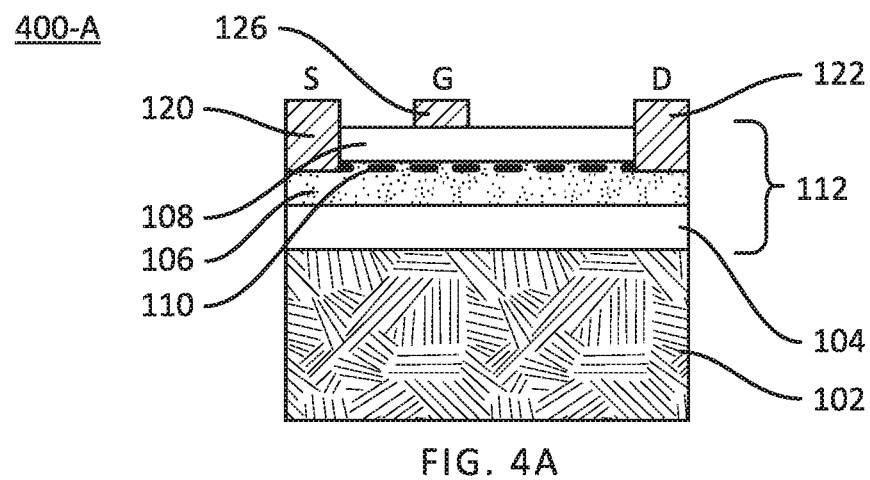
FIGS. 4A to 4F show simplified schematic cross-sectional diagrams to illustrate steps in a process flow to fabricate a device structure according to an embodiment of the present invention, such as shown in FIG. 3.

As shown in FIG. 4A, initially a device structure 400-A is provided, similar to that shown in FIG. 1, comprising a lateral GaN power transistor, fabricated on a silicon growth substrate 102. The GaN semiconductor layers comprise one or more buffer layers or intermediate layer 104, and a GaN heterostructure comprising a GaN layer 106 and an overlying AlGaN layer 108. The GaN/AlGaN hetero-structure layers 106/108 create a 2DEG active region 110 in device regions of the substrate. After forming these layers of the GaN epi-layer stack 112, source and drain electrodes are formed from a first metallization layer which is deposited and patterned to define a source electrode 120 and a drain electrode 122, e.g. a metal layer comprising Al/Ti which makes an ohmic contact with the underlying GaN/AlGaN hetero-structure. A Schottky gate electrode 126 is also defined over the channel region between the source and drain electrodes, e.g. comprising Pd. This GaN-on-Si transistor structure may be fabricated on a low cost, large diameter, native silicon substrate by any appropriate or conventional GaN-on-Si process technology. The GaN epi-layer stack may be, for example, 2 µm to 6 µm thick. A thinner epi-layer stack may be preferred to reduce wafer bowing.

As described in the above referenced related patent applications of the Applicant, large area lateral GaN power transistors may be fabricated using Island Technology™, to provide large gate width (Wg) multi-island transistors, comprising a repeating array of source and drain island electrodes, and respective gate electrodes running between adjacent source and drain island electrodes. In FIG. 3, and FIGS. 4A to 4E, for simplicity, only one of each of the source, drain and gate electrodes is shown.

Optionally, after completion of the wafer fabrications steps, comprising providing the on-chip metallization defining the source, drain and gate electrodes and external source, drain and gate contact pads, the wafer may be post-processed to add additional layers of conductive interconnect. These may comprise, for example, a thicker metallization layer and intervening dielectric layer, such as a copper redistribution layer (Cu RDL) and polyimide dielectric layer (which are not shown in the FIGS. 4A to 4E). The Cu RDL may be provided to interconnect multiple respective source and drain island electrodes, as disclosed, for example, in the Applicant's above referenced related PCT International Patent Application No. PCT/CA2015/000244 and U.S. provisional patent applications Nos. 61/980,101, 62/131,293, and 62/131,308. In an embodiment, Cu RDL is provided to define larger area external source, drain and gate contact pads for a multi-island lateral GaN power transistor.

Thus, after completion of the conventional GaN-on-Si wafer fabrication steps, and if applicable, the above mentioned wafer post-processing steps are completed to provide thick metal conductive interconnect, the GaN-on-Si die comprises large area external source, drain and gate contact pads for respective source, drain and gate electrodes of the GaN device.

At this point in processing, individual die on the wafer may be electrically tested, before or after dicing, to identify which die meet required specifications, i.e. to identify known-good die. It is envisaged that subsequent processing may be carried out at a wafer-scale for all die on a wafer. Alternatively, subsequent processing may be carried out using individual GaN-on-Si die, after dicing and electrical testing to identify known-good die for further processing.

For simplicity, FIGS. 4B to 4E show schematic diagrams illustrating fabrication of only one die comprising a single simplified lateral GaN transistor with only one of each of source, gate and drain electrodes, and respective external contact areas or contact pads provided by the on-chip metallization layers.

Figure 4B:
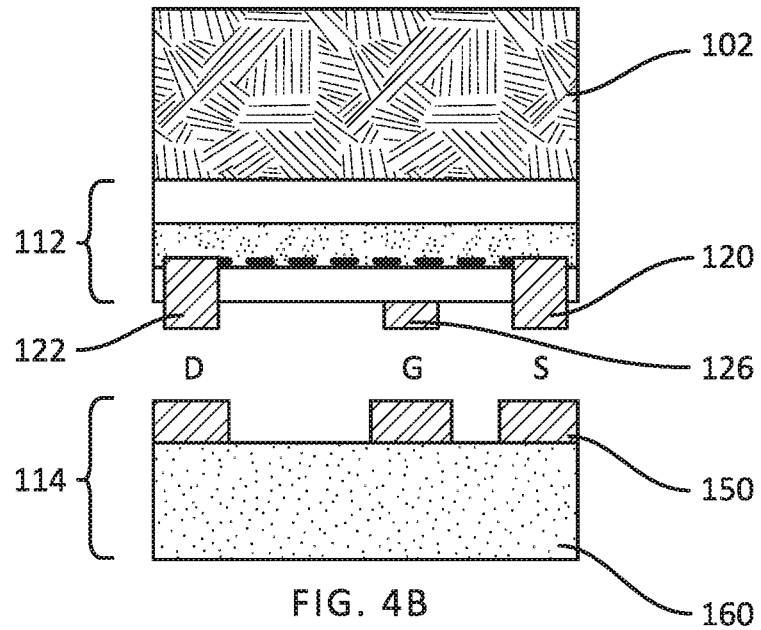
Figure 4C:
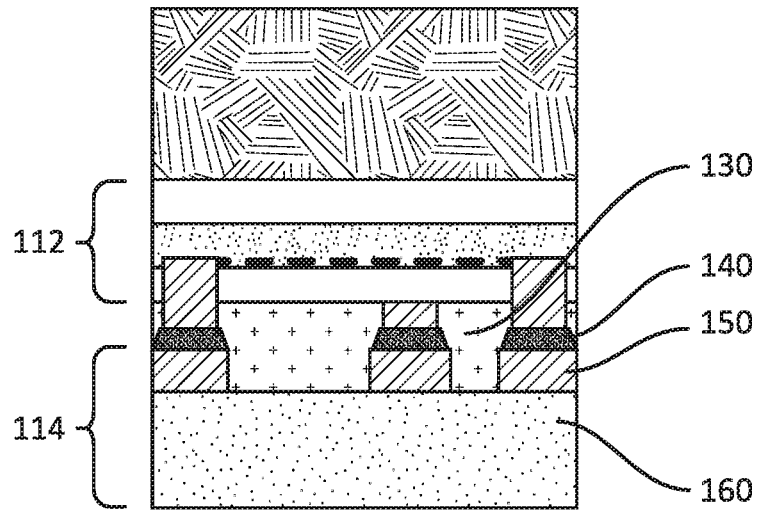

As illustrated by the device structure 400-C in FIG. 4C, a header 114 is provided and the GaN-on-Si die 400-B is flipped over for mounting on the header 114. As illustrated in FIG. 4B, the header 114 comprises a ceramic wafer 160, having formed thereon a layer of metallization 150, which is patterned to define conductive metal interconnect tracks for the source, drain and gate (S, D, G). The conductive tracks are patterned with contact areas for interconnection to the respective external contact areas (pads) of the on-chip metal for the source electrode 120, drain electrode 122 and gate electrode 126 of the transistor. That is, the metallization layer 150 is patterned to provide source, drain and gate contact areas matched to the arrangement of respective contact pads for the source, drain and gate on the GaN-on-Si die to allow for direct vertical attachment and interconnection, i.e. in flip chip configuration. The source, drain and gate contact areas of GaN-on-Si die are mounted on the respective corresponding source, drain and gate pads of the ceramic substrate 160 using a suitable attach material 140, which may, for example, be solder-tipped metal posts 150/140, or a layer of sintered silver, to provide the structure shown in FIG. 4C. The attach material provides for both mechanical attachment and electrical connection of the GaN-on-Si die to the ceramic substrate 160. Beneficially, the ceramic substrate wafer comprises a material having a CTE that is closely matched to that of the GaN epi-layer stack. Silicon nitride ($Si_3N_4$) is one suitable material. Aluminum Nitride (AlN) is another possible candidate. After the GaN-on-Si die is mechanically attached and electrically interconnected to the ceramic substrate wafer, underfill compound (i.e. a dielectric underfill) is injected between the epi-stack 112 and the header 160.

Thus, the header, comprising a metallized ceramic wafer, is attached to and becomes the permanent primary support substrate for the GaN epi-layer structure.

Figure 4D:
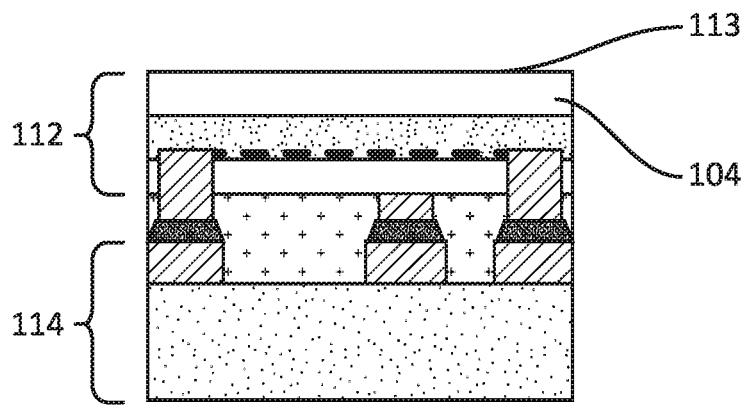

The silicon growth substrate is then removed from the other side of the epi-layer stack. The silicon growth substrate is removed, for example, using SF6 plasma etch or other suitable silicon removal process, to provide a structure 400-D as illustrated in FIG. 4D, exposing a back surface 113 (underlying surface) of the base or buffer layer 104 of the epi-stack. At this point, the metallized ceramic wafer, that is the header 114, becomes the permanent support substrate for the GaN device comprising the GaN epi-layer structure.

Figure 4E:
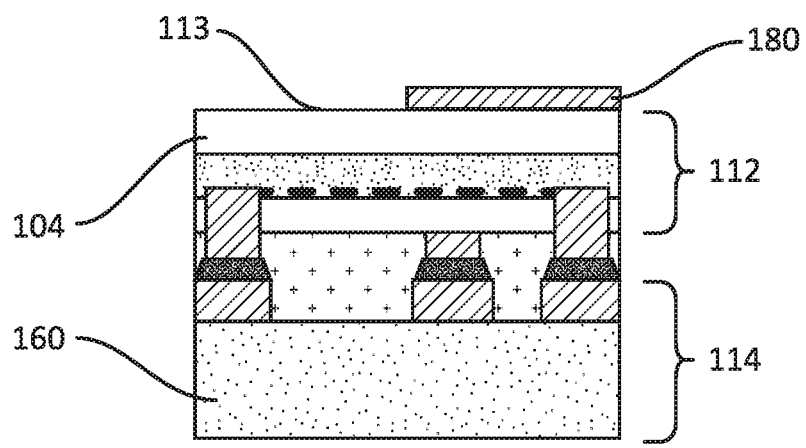

After removal of the native silicon substrate, a thin layer of conductive metallization 180 is patterned on the back surface 113 of the epi-layer stack to define field plates for the GaN transistor, as illustrated by the structure 400-E shown in FIG. 4E. For example, as illustrated, a field plate extends under the source and gate and some distance into the channel towards the drain.

Figure 4F:
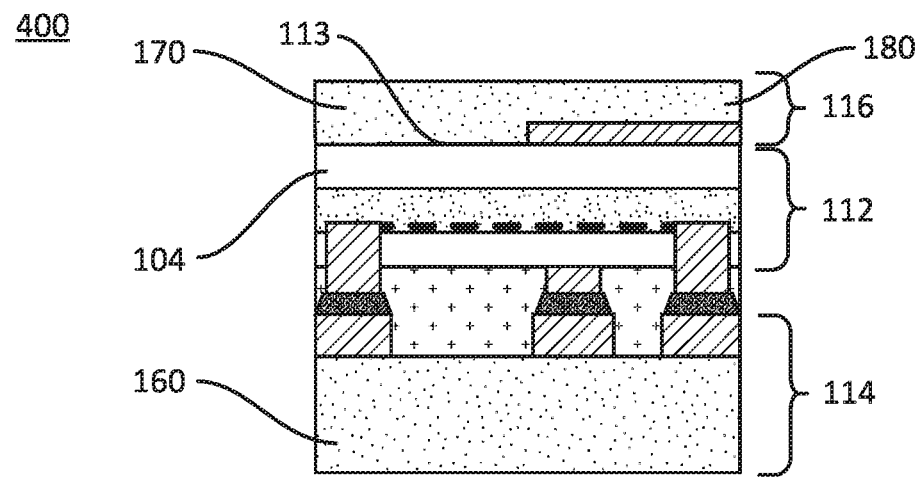

A composite thermal dielectric layer 170 is then provided on the exposed surface of the epi-stack and over the field plates, e.g. using spin-coating, or other appropriate low temperature deposition process, as shown in FIG. 4F. As described above, the composite thermal dielectric layer comprises a polymer dielectric with high dielectric strength and a dielectric filler having a high dielectric strength and a high thermal conductivity. The polymer dielectric is preferably a thermoplastic dielectric, and the composition and filler fraction is sufficient to impart thermal conductivity to the composite material. The filler preferably comprises micro-particles or nanoparticles of boron nitride, silicon nitride, or other suitable dielectric material. The composite thermal dielectric material is provided in a form that can be directly deposited or applied as a coating on the underlying surface of the epi-stack, to provide the completed structure 400 shown in FIG. 4F.

As illustrated, in the resulting structure 400 shown in FIG. 4F, the GaN epi-layer stack 112 is sandwiched between the header 114, which comprises the CTE matched ceramic support substrate 160, and the composite thermal dielectric layer 170. The latter provides a high dielectric strength, and a short thermal path from the GaN epi-stack. The relatively thick overlying ceramic substrate layer or wafer 160 provides physical rigidity and mechanical strength as the primary support substrate for the GaN epi-layer structure. A minimum thickness of the thinner composite layer 170 is determined by the breakdown strength of the selected ceramic material. For example, materials having a breakdown strength of 40 V/micron to 200 V/micron, i.e. a range typical of bulk boron nitride, the composite layer 170 may be e.g. about 50 µm thick, depending on the breakdown voltage requirements. It is preferably sufficient to provide a breakdown voltage of 1200V or more. However, another consideration is to provide a planarization layer, i.e. to provide a relatively flat back-side surface, over the field plate metallization layer 180. For this reason, deposition of a thicker composite layer 170 may be preferred to assist in planarizing the back-side, as well as increasing breakdown strength. However, the thickness of layer 170 is also selected to provide a short thermal path and low thermal resistance.

Ceramic substrate layer 160 of the header preferably comprises a material having excellent thermal conductivity, i.e. significantly better thermal conductivity than the original Si growth substrate. The ceramic support layer 160, which comprises, for example, silicon nitride ($Si_3N_4$) or aluminum nitride (AlN), has a thickness typical of a conventional silicon substrate, e.g. nominally 320 µm or more, as required to provide adequate mechanical strength to the device structure. Since the ceramic substrate 160 is directly interconnected by the metal tracks to the on-chip metal defining the source, drain and gate pads, using conventional die attach techniques, the need for a conventional organic adhesive layer, such as benzocyclobutene, is eliminated. As required, any gaps between components are filled with dielectric underfill, which also mechanically strengthens the structure, to reduce risk of damage during conventional wafer post—processing, e.g. dicing to provide individual device die.

In some prior art methodologies using substrate transfer, a temporary carrier wafer is used to reinforce the epi-stack, while the native original Si substrate is removed and replaced with an alternative support substrate on the backside of the epi-stack, and then the temporary carrier wafer is removed.

In contrast, in the methodology disclosed herein, a permanent header 114 comprising the metalized ceramic wafer 160 is provided on the front side and a thinner ceramic substrate 116 is provided on the back side of the epi-layer stack 112, so that the GaN device structure comprising GaN epi-layer stack 112 is sandwiched between the thicker ceramic header 114 and the thinner thermal substrate 116.

The wafer is thus strengthened from the front-side (original 'top') of the epi-stack by permanently attaching the overlying structure, which then acts as the primary support substrate. The native silicon substrate is replaced with a thinner permanent ceramic layer 170 which has a CTE matched to epi-stack, and which may be metallized to define field plates. The ceramic wafer 160 provides mechanical strength and support, so that the back side original silicon growth substrate may therefore be entirely removed, and replaced with a thin ceramic layer, which beneficially removes the vertical breakdown path and also provides a reduced thermal path for thermal dissipation.

Because of the thick overlying ceramic wafer structure, which becomes the primary substrate, the final structure is physically more robust and better resists damage during dicing. The composite thermal dielectric layer may be made very thin, to reduce the thermal path from the back of the epi-stack because it is not required to provide mechanical support to the finished device structure.

Beneficially the thin layer of composite thermal dielectric is directly applied to the backside of the epi-layer stack, e.g. by spin-coating and curing or other known deposition process at low temperature. A back-side layer of metallization may be added and patterned to provide field plates. The field plates also contribute to further increasing the breakdown voltage.

The resulting structure circumvents the poor thermal performance of prior structures using substrate removal and epi-layer transfer from silicon to a substitute glass or sapphire substrate wafer to provide high breakdown voltage.

Figure 5A:
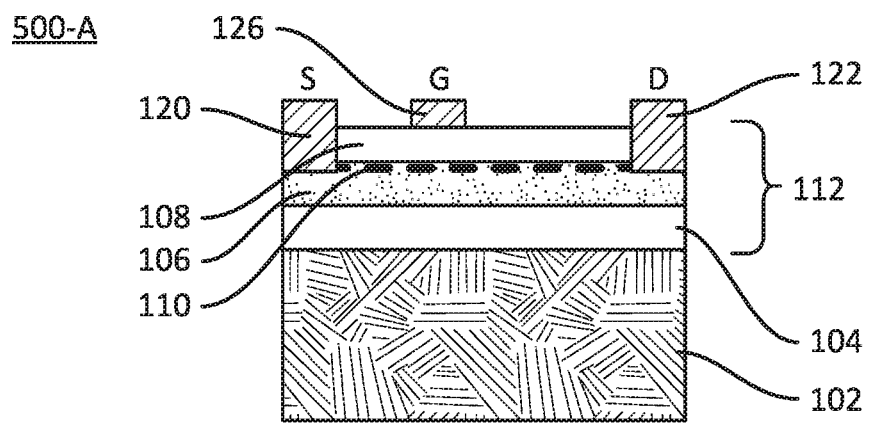
FIGS. 5A to 5F show simplified schematic cross-sectional diagrams to illustrate steps in a process flow to fabricate a device structure according to another embodiment of the present invention.
Figure 5B:
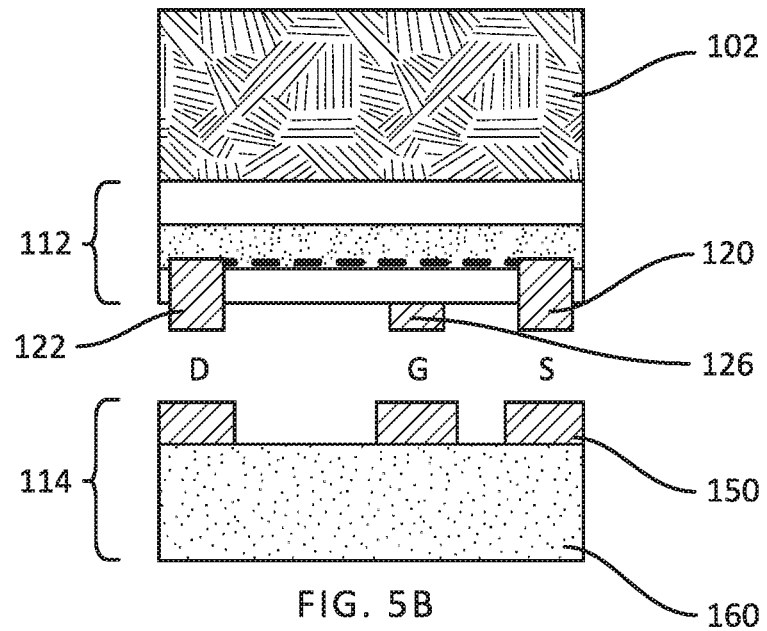
Figure 5C:
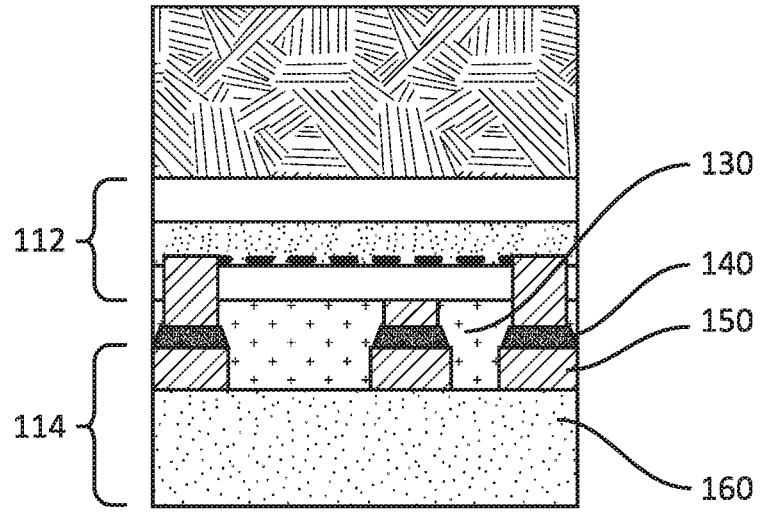
Figure 5D:
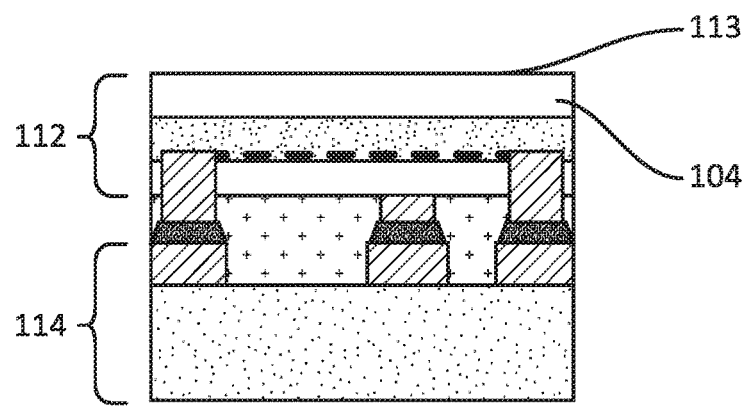
Figure 5E:
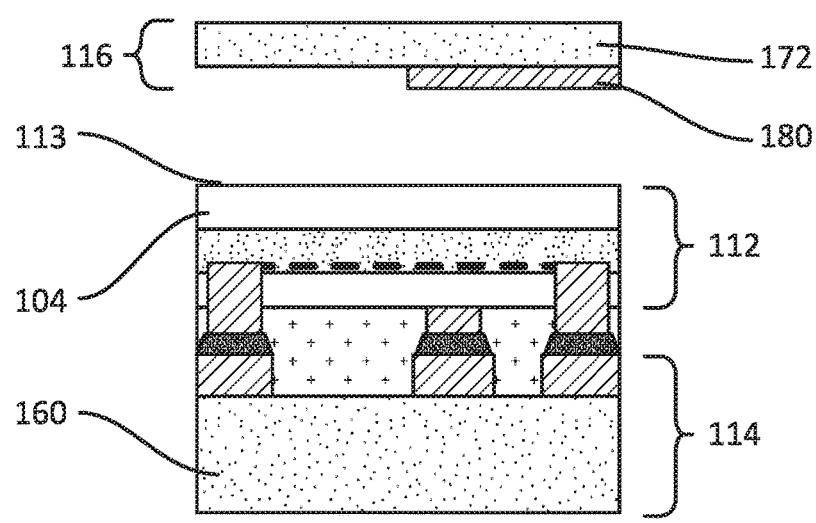

Fabrication of a device structure according to yet another embodiment is illustrated schematically in FIGS. 5A to 5F. The structures 500-A, 500-B, and 500-C formed by the initial fabrication steps, as illustrated in FIGS. 5A to 5D, which are similar to those shown in FIGS. 4A to 4D. However, as illustrated in FIG. 5E, in this embodiment the thermal substrate 116 further comprises a heatspreader, i.e. a ceramic thermal layer 172, which is provided as a separate layer, e.g. a wafer, sheet or foil. The field plate metallization 180 is provided thereon, e.g. deposited and patterned. The substrate 116 comprising the ceramic layer 172 and field plate metallization 180 is then adhesively bonded to the backside of the epi-layer stack with a layer 190, which comprises a composite thermal dielectric layer 190, such as described above, comprising a thermoplastic polymer dielectric having a high dielectric strength and a dielectric filler of thermally conductive particles. For example, the thermal dielectric layer comprises thermoplastic polyimide (TPI) with dielectric filler particles comprising a suitable ceramic material, which is electrically insulating and thermally conductive. The particulate dielectric filler may comprise micro-particles and/or nano-particles of a material with high thermal conductivity, such as, silicon nitride, boron nitride, or aluminum nitride, and diamond. Nano-particulate dielectric materials may comprise e.g. non-conductive nano-tubes of carbon, boron nitride or mixtures thereof. As noted above, a dielectric filler comprising boron nitride nano-tubes (BNNT) offers high dielectric strength and exceptional thermal conductivity.

In the latter embodiment, as illustrated in FIGS. 5A to 5F, the composite thermal dielectric acts as an attachment layer or adhesive layer for a ceramic heatspreader, e.g. silicon nitride or aluminum nitride.

In variants of this embodiment, the heatspreader 172 may comprise a layer of a thermally conductive metal or metal alloy. Use of the composite thermal dielectric material as an adhesive bonding material provides a practical method for fabrication of a device structure with a conventional metal heatspreader.

While it is preferred that the material of heatspreader layer is CTE matched to the GaN epi-layer stack, beneficially, use of a thermoplastic layer or layers, such as ceramic filled TPI, provides an adhesive layer with mechanical properties, including some flexibility, which assists in reducing interface stresses due to CTE mismatch between the ceramic layer 172 and the GaN epi-layer stack 112, as well as providing a layer having the required thermal and electrical properties to provide a high vertical breakdown voltage and low thermal resistance.

Figure 6:
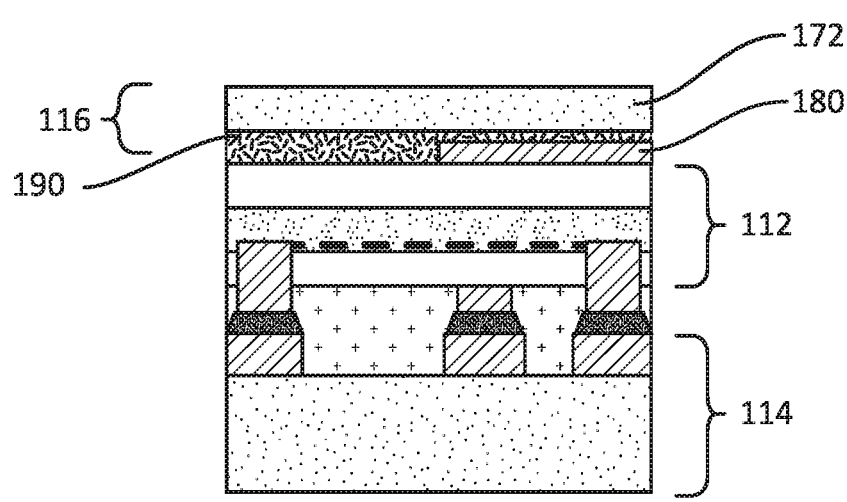
FIG. 6 shows a simplified schematic cross-sectional diagram of a device structure of a further embodiment of the present invention.

As illustrated in FIG. 6, in a device structure of yet another embodiment, fabricated by a different process sequence, a conductive metallization layer 180 is deposited and patterned on the back-side of the epi-layer stack, to define field plates. Then, a ceramic thermal substrate layer 172 is adhesively bonded to the device structure by a composite thermal dielectric layer in the form of a thermally conductive, electrically non-conductive, adhesive layer 190 such as described above, e.g. BNNT filled TPI.

In view of the availability of large diameter, lower cost silicon substrates, it is desirable to be able to increase wafer scale processing for conventional GaN-on-Silicon structures to enable use of at least 8 inch or 12 inch silicon wafers. However, because of the lattice mismatch of GaN to Silicon, and the requirement to use thicker GaN layers to increase breakdown voltage, e.g. 6 μm GaN epi-layers, thicker GaN epi-layers tend to causes significant stresses and wafer bowing when using large scale wafers.

Post-processing as described herein provides a device structure, which improves the breakdown voltage of lateral GaN power transistors. In some embodiments, this enables the use of a thinner epi-stack, e.g. 2 μm, while providing a breakdown voltage of at least 1000V. The thinner epi-layer stack thickness helps to reduces stresses and wafer bowing during epitaxial growth, that is caused by the GaN/Si lattice mismatch, so that use of larger diameter wafers for larger scale fabrication becomes feasible.

As disclosed herein, elements of wafer post-processing and/or die post-processing combine with packaging elements to streamline manufacture. It is envisaged that in variants of the embodiments described above, and in other alternative embodiments, the structure may be fabricated before or after dicing of the individual Ga-on-Si die. For example, a plurality of tested, known-good GaN-on-Si die may be mounted on a header comprising a thick ceramic layer 160, such as a silicon nitride wafer, and then subsequent steps are performed to remove the native silicon substrate and then apply a composite thermal dielectric layer 190, and optionally attach the thermal ceramic layer 170 or other heatsink layer. In other embodiments the GaN-on-Si wafer may be attached to header 160, then the silicon substrate is removed from the wafer assembly, and the composite thermal dielectric substrate 170 is then formed, before dicing of individual GaN die.

Figure 5F:
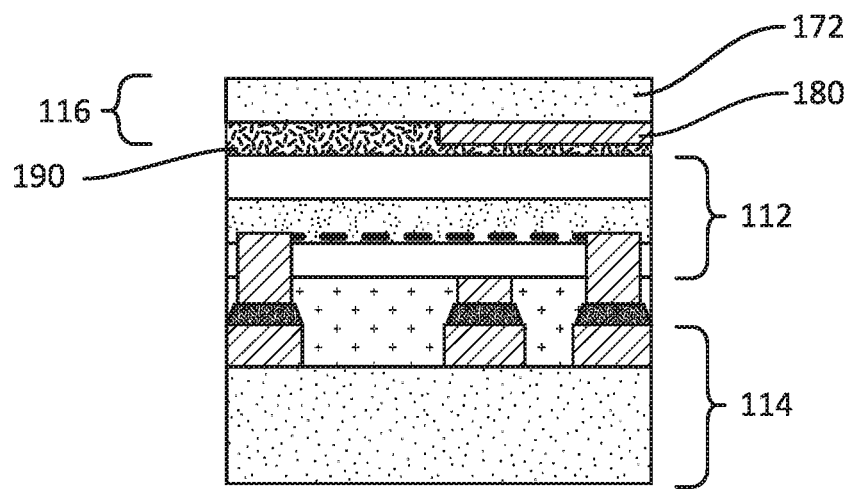

After completion of the GaN device structures as illustrated schematically in FIGS. 3, 4F and 5F, external connections are provided to the source, drain and gate of the transistor by conventional methods, such as, metal vias through the ceramic support layer 160 of header 114, or alternatively, clips or wirebonding to external contact pads on the ceramic header.

Figure 7A:
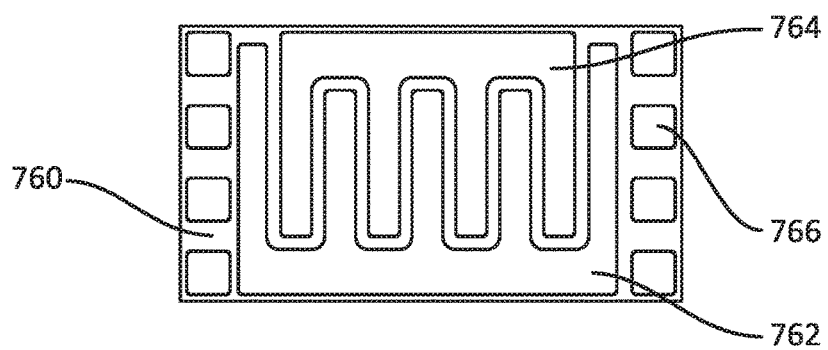
FIGS. 7A, 7B and 7C show schematic diagrams of, respectively, a front-side plan view, a back-side plan view, and a cross-sectional view of a nitride semiconductor device structure comprising a GaN power transistor according to yet another embodiment of the invention.
Figure 7B:
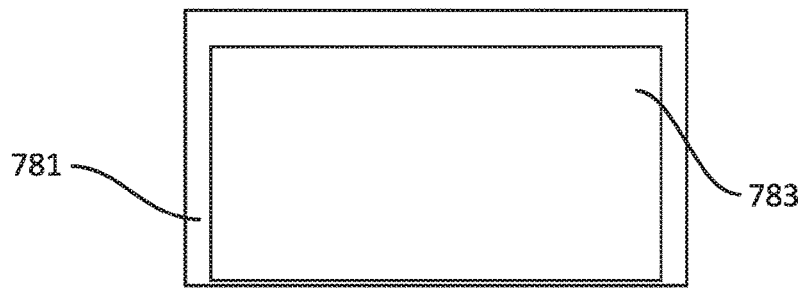
Figure 7C:
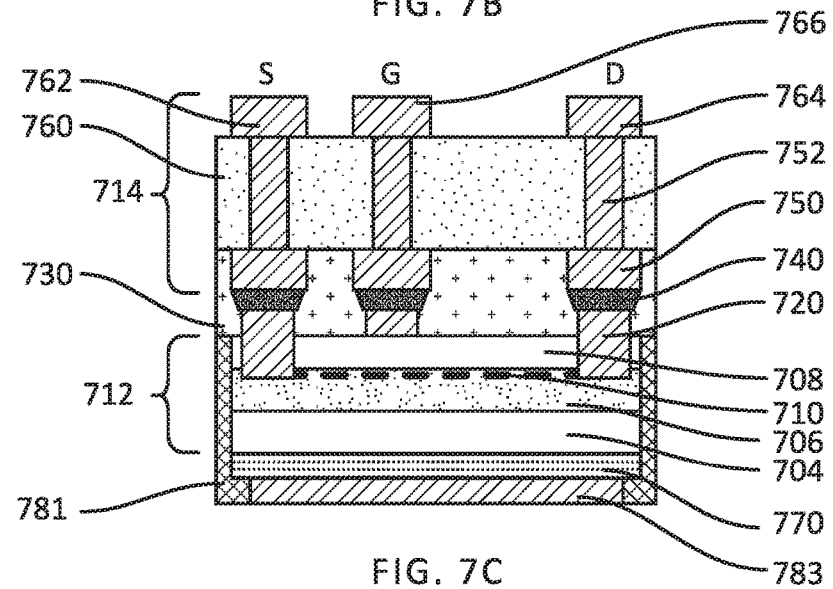

One example of an embodiment of a resultant device structure using metal vias through the ceramic support layer is illustrated schematically in FIGS. 7A, 7B and 7C. A frontside plan view of the finished device structure 700 is shown in FIG. 7A and comprises large area copper pads 762, 764 and 768, respectively, for external connections to the source, drain and gate of the lateral GaN transistor. A backside plan view is shown in FIG. 7B and shows a large area backside pad of a thermally conductive and electrically conductive layer of silver filled Kapton 783 and surrounding plastic overmolding 781. As illustrated in FIG. 7C, in a schematic cross-sectional view, the device structure comprises a GaN epi-layer stack 712 comprising layers 704, 706 and 708 similar to those described in other embodiments. That is, intermediate/buffer layers 104, GaN layer 706 and AlGaN layer 708 forming a 2DEG active layer 710. An underlying composite thermal dielectric layer 770, comprises BNNT filled Kapton. The back-side layer of thermally conductive and electrically conductive material 783, comprising silver filled Kapton is provided thereon. An overlying header 714 comprises ceramic wafer, i.e. ceramic layer 760, on which is formed a patterned metallization layer 750 defining conductive metal tracks which are mechanically attached and electrically interconnected to respective source, drain and gate contact areas of the GaN device structure by low inductance interconnects comprising copper metal posts 720 with solder tips 740. The external contact pads 762, 764 and 766 are formed by a patterned metal layer on the other side of the ceramic layer 760. Conductive vias 752 are defined through the ceramic layer 760 to provide interconnections from the source, drain and gate tracks, formed by the metallization layer 750, to respective source, drain and gate contact pads 762, 764, and 766 on the front side of the device structure.

Although nitride semiconductor device structures and methods of several embodiments are described in detail herein, in methods according to other embodiments, the wafer is diced into individual GaN-on-Si die before further processing, or the entire silicon substrate is removed before dicing.

For known-good die assembly, the GaN wafer may be fully diced before substrate removal. The resultant die are then mounted on the header comprising the permanent ceramic substrate as previously described, before further processing. This process flow provides several possible advantages; e.g. underfilling is facilitated. A packaging strategy featuring Cu leads, such as disclosed in the Applicant's related applications, may be used for high current die. Also, after testing, only known-good die need to be packaged. However, this single die approach may be more expensive than wafer scale processing.

Alternatively, for wafer scale processing, an entire GaN-on-Si wafer is mounted to the carrier substrate. In this approach, external connections could be made through metalized metal vias defined through the thick dielectric substrate wafer, such as shown in FIG. 7C. This structure would allow for device packaging with front-side and/or back-side cooling. In yet another embodiment, the entire GaN-on-Si wafer is mounted on the header, as described above and the dielectric substrate layer is patterned with openings or perforations, e.g. to facilitate injection of dielectric underfill.

Thermal Modelling

Figure 8:
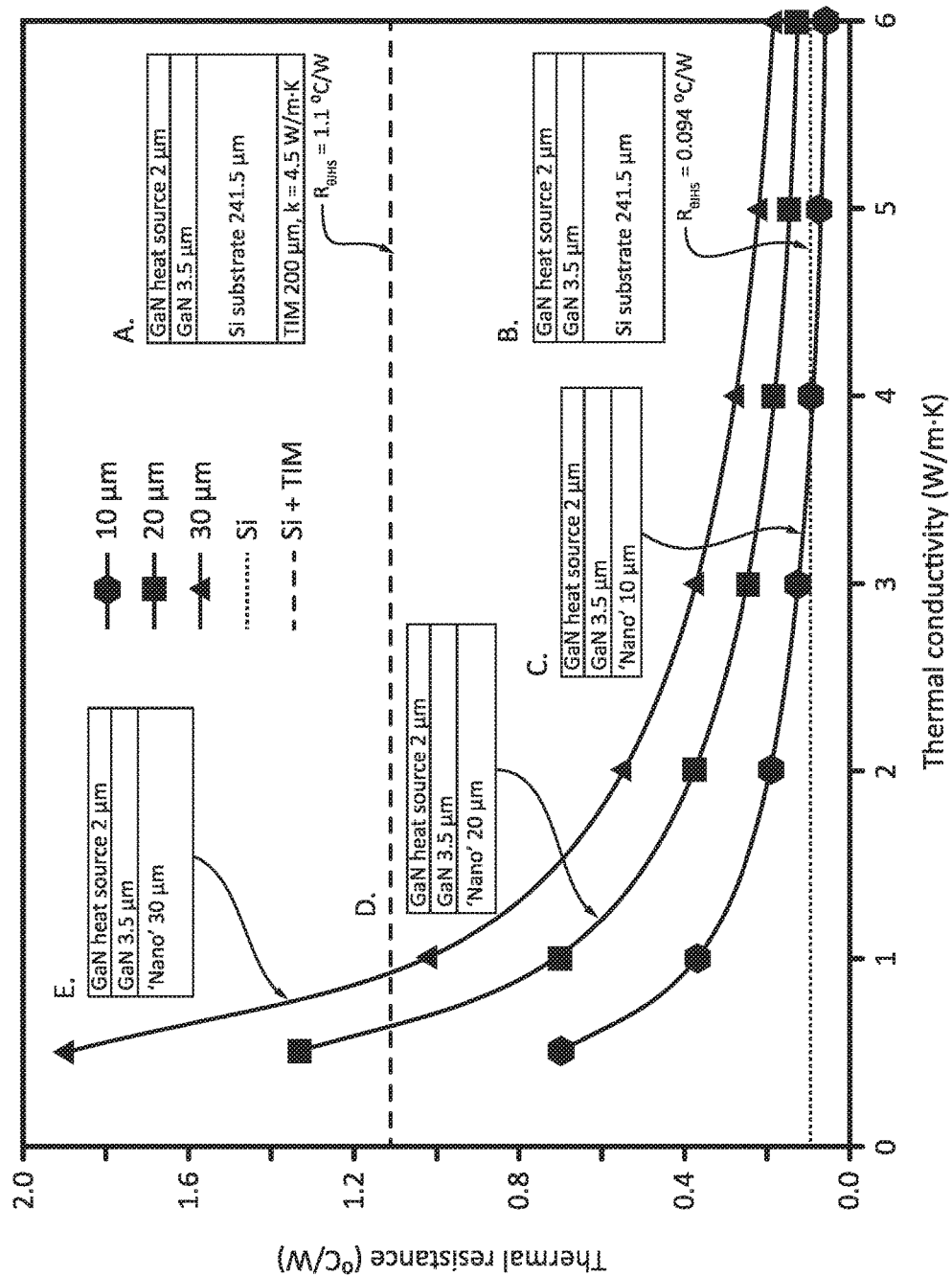
FIG. 8 shows thermal modelling data plotted as thermal resistance (° C./W) vs. thermal conductivity (W/m·K) for an example of a lateral GaN power transistor fabricated as a GaN-on-Si device with and without a layer of thermally conductive, electrically insulating material (TIM layer), and after removal of the silicon growth substrate and replacement with a BNNT filled composite thermal dielectric layer according to an embodiment of the invention.

By way of example, FIG. 8 shows some thermal modelling data plotted as thermal resistance (° C./W) vs. thermal conductivity (W/m·K). For the simulations, the GaN epi-layer structure of a GaN lateral transistor was modelled as a 2 μm GaN "heat source" layer on an underlying 3.5 μm GaN layer formed on a 241.5 μm silicon substrate.

Line A (dashed line) of the plot indicates the thermal resistance for an example of a lateral GaN power transistor fabricated as a GaN-on-Si device with a layer of a conventional thermally conductive, electrically insulating material (TIM layer). The latter is modelled as having a 200 μm thickness and a thermal conductivity of k=4.5 W/m·K. Data for the same structure without the TIM layer is shown by line B (dotted line). As illustrated, compared to a bare GaN-on-Si die, addition of a conventional TIM layer to increase the breakdown voltage to 850V increases thermal resistance 10 fold, from 0.1° C./W to 1.1° C./W.

Also shown are plots for a similar GaN device structure after removal of the silicon growth substrate, and replacement of the silicon growth substrate with a composite thermal dielectric layer, comprising BNNT filled TPI or Kapton, to provide a structure similar to the embodiments described above. Again, the GaN epi-layer structure comprising the GaN lateral transistor were modelled as a 3.5 μm GaN "heat source" layer and a 2 μm GaN layer. Simulation results are shown in plots C, D and E of FIG. 8 for a GaN device structure in which the Si growth substrate is replaced with a composite thermal dielectric layer having a thickness of, respectively, 10 μm, 20 μm and 30 μm. For example, 10 μm to 30 μm of a composite thermal dielectric layer with a projected thermal conductivity of between 2 and 5 W/m·K provides a thermal resistance approaching that of the GaN epi-layer structure after substrate removal (dotted line). For example, if the TPI is filled with BNNT to achieve a thermal conductivity of 3.5 W/m·K, a 10 μm layer thickness provides a thermal resistance of ~0.1° C./W, which is close to that of a bare GaN-on-Si die. Even assuming that a thicker layer of the composite thermal dielectric layer is required to provide a required breakdown voltage of 1200V or more, e.g. a thickness of 20 μm, a thermal resistance of 0.2° C./W is achieved. This is a significant improvement relative to the thermal resistance of 1.1° C./W the GaN-on-Si device structure with a conventional TIM layer.

INDUSTRIAL APPLICABILITY

Semiconductor device structures comprising high voltage, high current GaN power transistors, and methods of fabrication thereof, according to embodiments of the present invention are disclosed wherein a GaN semiconductor device comprises a GaN epi-layer stack sandwiched between an overlying header, which includes a support layer of relatively thick dielectric layer, and an underlying, relatively thin composite thermal dielectric thermal layer. The device structure is fabricated by providing a conventional GaN device structure fabricated on a low cost silicon substrate (GaN-on-Si die); mechanically and electrically attaching source, drain and gate contact pads of the GaN-on-Si die to corresponding contact areas of conductive tracks of the header; entirely removing the silicon growth substrate; and applying a layer of composite thermal dielectric.

Preferably, the replacement header comprises a dielectric support layer of a ceramic material having a CTE matched to the GaN epi-layer stack, and which is available in wafer form at reasonable cost. The composite thermal dielectric layer preferably comprises a thermoplastic polyimide or epoxy dielectric having a high dielectric strength filled with a dielectric filler having a high dielectric strength and a high thermal conductivity, e.g. micro-particles or nano-particles of boron nitride, aluminum nitride, or silicon nitride, or mixtures thereof. The composite layer is of a thickness to provide a required breakdown voltage, preferably 1200V or more, while being sufficiently thin to provide a short thermal path and low thermal resistance. Beneficially, when the composite thermal dielectric layer comprises dielectric filled TPI, such as BNNT filled TPI, it can be applied to the required thickness using conventional low temperature processing methods, such as spin-coating.

The resulting device structure provides for improved electrical breakdown resistance and more effective thermal dissipation compared to devices fabricated on conventional GaN-on-Si die.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A nitride semiconductor device comprising:
   a GaN die comprising a lateral GaN transistor, the GaN die being sandwiched between an overlying header and an underlying composite thermal dielectric layer;
   the GaN die comprising:
   a GaN epi-layer stack comprising a GaN/AlGaN hetero-layer structure defining a two dimensional electron gas (2DEG) active layer for the lateral GaN transistor, and at least one underlying layer;
   one or more layers of on-chip metallization being provided on a front side of the GaN epi-layer stack, overlying the GaN/AlGaN hetero-layer structure, the on-chip metallization defining source and drain electrodes of the lateral GaN transistor, a gate electrode formed on a channel region between the source and drain electrodes of the lateral GaN transistor, and contact pads for said source, drain and gate electrodes; and
   the overlying header comprising:
   a support substrate comprising a dielectric material having a coefficient of thermal expansion (CTE) closely matched to the CTE of the GaN epi-layer stack and a conductive metallization layer formed on the support substrate defining conductive tracks for source, drain and gate interconnections;
   the overlying header being attached to the GaN die by low inductance conductive interconnections between the contact pads for the source, drain and gate electrodes of the lateral GaN transistor and corresponding source, drain and gate contact areas of the conductive tracks of the overlying header;
   a conductive layer in direct contact with a back-side of the GaN-epilayer stack, the conductive layer being patterned to define one or more back-side field plates of the lateral GaN transistor;
   the composite thermal dielectric layer comprising:
   a high dielectric strength polymer dielectric and a dielectric filler,
   the high dielectric strength polymer dielectric comprising one of a polyimide and an epoxy, and the dielectric filler being a material having a high dielectric strength and a high thermal conductivity selected from the group consisting of Boron Nitride, Aluminum Nitride, Silicon Nitride, diamond, and mixtures thereof,
   the composite thermal dielectric layer forming a coating in direct contact with the back-side of the GaN epi-layer stack and a backside of the one or more back-side field plates, and
   wherein the composite thermal dielectric layer has a dielectric strength of at least 40V/μm and a thermal conductivity of about 2W/m.K or more, and the composite thermal dielectric layer has a thickness that provides a breakdown voltage of at least 850V and a thermal resistance of less than 1° C./W.

2. The device of claim 1, wherein:
   when the high dielectric strength polymer dielectric comprises a polyimide, the polyimide comprises a thermoplastic polyimide (TPI) and the dielectric filler is selected from the group consisting of a micro-particulate form of Boron Nitride, Aluminum Nitride, Silicon Nitride, and diamond, and
   said micro-particulate form comprising micro-particles, micro-flakes, micro-platelets, micro-fibers, nano-particles, nano-platelets, nano-tubes, nano-fibers, and mixtures thereof.

3. The device of claim 1, wherein:
   when the high dielectric strength polymer dielectric comprises a polyimide, the polyimide comprises a thermoplastic polyimide (TPI) and the dielectric filler is selected from the group consisting: Boron Nitride Nano-Tubes (BNNT); Cubic boron nitride powder (c-BN), Boron Nitride nano-particles; hexagonal Boron Nitride flakes (h-BN); and mixtures thereof.

4. The device of claim 1, wherein said dielectric strength is at least 100 V/μm and said thermal conductivity is in the range from about 2 W/m.K to 5W/m.K, and said thickness of the composite thermal dielectric layer being in the range from 10 μm to 50 μm wherein said breakdown voltage is in the range from 850V to 2000V and said thermal resistance is less than 1° C./W.

5. The device of claim 3, wherein the dielectric filler of the composite thermal dielectric layer comprises a particle size and filler fraction such that said dielectric strength is at least 100V/μm and said thermal conductivity is in the range from about 2 W/m.K to 5 W/m.K, and wherein when said thickness of the composite thermal dielectric layer is in the range from 10 μm to 50 μm, said breakdown voltage is in the range from 850V to 2000V and said thermal resistance is less than 1° C./W.

6. The device structure of claim 1, wherein the composite thermal dielectric layer comprises one or more spin-coated layers.

7. The device structure of claim 1, further comprising a heatspreader layer of a material having a high dielectric strength and a high thermal conductivity selected from the group consisting of Boron Nitride (BN), Aluminum Nitride (AlN), Silicon Nitride (Si$_3$N$_4$), and diamond (C), the heatspreader layer being bonded to the back-side of the GaN epi-layer stack by said composite thermal dielectric layer.

8. The device structure of claim 1, further comprising a heatspreader comprising a thermally conductive layer of a ceramic, a metal or a metal alloy, the heatspreader being adhesively bonded to the back-side of the GaN epi-layer stack by said composite thermal dielectric layer.

9. The device structure of claim 1, wherein the conductive layer defining the one or more back-side field plates comprises a metal filled thermoplastic polyimide material.

10. The device structure of claim 1, further comprising external front-side source, drain and gate contact pads provided on an external surface of the support substrate, and low inductance conductive vias extending through the support substrate from said external front-side source, drain and gate contact pads to the conductive metallization layer formed on the support substrate.

11. A method of fabricating the nitride semiconductor device of claim 1, comprising:
providing a GaN die comprising a silicon growth substrate having formed thereon a GaN epi-layer stack; the GaN epi-layer stack comprising a GaN/AlGaN hetero-layer structure defining a 2DEG active layer for a lateral GaN transistor and at least one underlying layer;
providing on a front-side of the GaN epi-layer stack, overlying the GaN/AlGaN hetero-layer structure, one or more layers of on-chip metallization defining source and drain electrodes of the lateral GaN transistor, a gate electrode formed on a channel region between the source and drain electrodes of the lateral GaN transistor, and contact pads for said source, drain and gate electrodes;
providing a header comprising a support substrate of dielectric material having a CTE closely matched to the CTE of the GaN epi-layer stack, and a conductive metallization layer formed on the support substrate defining conductive tracks and contact areas for source, drain and gate interconnections, said contact areas for source, drain and gate interconnections having an arrangement for alignment and interconnection with the contact pads for the source, drain and gate electrodes of the GaN transistor;
aligning and assembling the GaN die and the header by providing low inductance conductive interconnections mechanically and electrically interconnecting the contact pads for the source, drain and gate electrodes of the lateral GaN transistor with the contact areas for source, drain and gate interconnections, respectively;
removing the growth substrate from the backside of the epi-layer stack to expose a back-side of the GaN epi-layer stack comprising an underlying buffer layer or intermediate layer of the GaN epi-layer stack, the GaN die then being supported by the header;
providing a conductive layer in direct contact with the back-side of the GaN epi-layer stack, said conductive layer being patterned to define one or more back-side field plates of the lateral GaN transistor;
applying a composite thermal dielectric layer in direct contact with the back-side of the GaN epi-layer stack and a back-side of the one or more back-side field plates,
the composite thermal dielectric layer comprising a high dielectric strength polymer dielectric and a dielectric filler, the high dielectric strength polymer dielectric comprising one of a polyimide and an epoxy, and the dielectric filler being a material having a high dielectric strength and a high thermal conductivity selected from the group consisting of Boron Nitride (BN), Aluminum Nitride (AlN), Silicon Nitride (Si$_3$N$_4$), and diamond (C); and
wherein the composite thermal dielectric layer has a dielectric strength of at least 40V/μm and a thermal conductivity of about 2W/m.K or more, such that a thickness of 10 μm to 50 μm provides a breakdown voltage of at least 850V and a thermal resistance of less than 1° C./W.

12. The method of claim 11, wherein when the high dielectric strength polymer dielectric comprises a polyimide, the polyimide comprises a thermoplastic polyimide (TPI) and the dielectric filler is selected from the group consisting of a micro-particulate form of Boron Nitride (BN), Aluminum Nitride (AlN), Silicon Nitride (Si$_3$N$_4$), and diamond (C), and said micro-particulate form comprising micro-particles, micro-flakes, micro-platelets, micro-fibers, nano-particles, nano-platelets, nano-tubes, nano-fibers, and mixtures thereof.

13. The method of claim 11, wherein when the high dielectric strength polymer dielectric comprises a polyimide, the polyimide comprises a thermoplastic polyimide (TPI) and the polyimide comprises a thermoplastic polyimide (TPI) and the dielectric filler is selected from the group consisting: Boron Nitride Nano-Tubes (BNNT); Cubic boron nitride powder (c-BN), Boron Nitride nano-particles; hexagonal Boron Nitride flakes (h-BN); and mixtures thereof.

14. The method of claim 11, wherein applying the composite thermal dielectric layer comprises spin-coating and curing one or more coats to provide said thickness of the composite thermal dielectric layer and wherein said thickness provides said breakdown voltage in the range from 850V to 2000V and said thermal resistance of less than 1° C./W.

15. The method of claim 11, comprising applying the composite thermal dielectric layer wherein said thickness is in the range from 10 μm to 50 μm, said breakdown strength in the range from 850V to 2000V, and said thermal resistance is of less than 1° C./W.

16. The method of claim 11, wherein said composite thermal dielectric layer forms an adhesive layer, and further comprising bonding a heatspreader to the back-side of the GaN epi-layer stack with said adhesive layer.

17. The method of claim 11, further comprising testing the GaN die before performing the step of mechanically and electrically interconnecting the contact pads for the source, drain and gate electrodes of the lateral GaN transistor with the contact areas for source, drain and gate interconnections.

18. A nitride semiconductor device structure comprising:
a GaN epi-layer stack sandwiched between an overlying dielectric support substrate and an underlying, relatively thin dielectric thermal layer;
the GaN epi-layer stack comprising a GaN/AlGaN hetero-layer structure defining a 2DEG active region for a lateral GaN transistor and one or more underlying intermediate layers or buffer layers;
at least one layer of on-chip metallization provided on a front-side of the GaN epi-layer stack, overlying the GaN/AlGaN hetero-layer structure, the on-chip metallization defining source and drain electrodes of the lateral GaN transistor, a gate electrode formed on a channel region between the source and drain electrodes, and external contact pads for the source, drain and gate electrodes;

the overlying support substrate comprising a layer of a dielectric material having a coefficient of thermal expansion (CTE) closely matched to the CTE of the GaN epi-layer stack, and the overlying support substrate comprising a layer of conductive metallization defining conductive tracks for source, drain and gate interconnections;

the external contact pads for the source, drain and gate electrodes of the lateral GaN transistor being mechanically and electrically interconnected by low inductance interconnections to corresponding source, drain and gate contact areas of said conductive tracks of the overlying support substrate, and dielectric underfill filling gaps between said low inductance interconnections;

a conductive layer formed in direct contact with a back-side of the GaN the epi-layer stack, the conductive layer being patterned to define one or more back-side field plates of the lateral GaN transistor; and the dielectric thermal layer applied in direct contact with the back-side of the GaN epi-layer stack and a back-side of the one or more back-side field plates, the thermal dielectric layer having a high thermal conductivity, a CTE closely matched to CTE of the GaN epi-layer stack, and a dielectric strength of at least 40V/μm, whereby a layer thickness of the thermal dielectric layer having a thickness of approximately 50 μm provides a breakdown voltage of at least 1000V.

19. A nitride semiconductor device structure of claim 18, wherein the dielectric thermal layer comprises a layer of aluminum nitride or a layer of boron nitride.

* * * * *